US008609991B2

(12) United States Patent
Takahashi

(10) Patent No.: US 8,609,991 B2
(45) Date of Patent: Dec. 17, 2013

(54) FLEX-RIGID WIRING BOARD AND METHOD FOR MANUFACTURING THE SAME

(75) Inventor: Michimasa Takahashi, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 302 days.

(21) Appl. No.: 12/489,864

(22) Filed: Jun. 23, 2009

(65) Prior Publication Data

US 2010/0025087 A1  Feb. 4, 2010

Related U.S. Application Data

(60) Provisional application No. 61/084,685, filed on Jul. 30, 2008.

(51) Int. Cl.
*H05K 1/00* (2006.01)
*H05K 3/00* (2006.01)

(52) U.S. Cl.
USPC ............. 174/254; 174/262; 29/829; 361/748; 361/749

(58) Field of Classification Search
USPC .......................................................... 174/254
See application file for complete search history.

(56) References Cited

U.S. PATENT DOCUMENTS

| 4,715,928 | A | * | 12/1987 | Hamby ............................ 216/18 |
| 5,206,463 | A | * | 4/1993 | DeMaso et al. ................. 174/254 |
| 6,925,255 | B2 | * | 8/2005 | Watanabe et al. .............. 396/301 |
| 7,210,942 | B2 | * | 5/2007 | Uchida et ........................ 439/67 |
| 7,292,448 | B2 | * | 11/2007 | Urushibara et al. ........... 361/748 |
| 7,423,219 | B2 | * | 9/2008 | Kawaguchi et al. ........... 174/254 |
| 8,071,883 | B2 | | 12/2011 | Takahashi et al. |
| 2004/0008982 | A1 | | 1/2004 | Matsuo et al. |
| 2005/0047776 | A1 | | 3/2005 | Watanabe et al. |
| 2007/0126123 | A1 | * | 6/2007 | Sawachi ......................... 257/777 |
| 2008/0047737 | A1 | | 2/2008 | Sahara et al. |
| 2008/0118200 | A1 | * | 5/2008 | Kim et al. ........................ 385/14 |

FOREIGN PATENT DOCUMENTS

| JP | 61-058294 | 3/1986 |
| JP | 05-259647 | 10/1993 |
| JP | 6-158294 A1 | 6/1994 |
| JP | 2003-086761 | 3/2003 |
| JP | 2003-332743 | 11/2003 |
| JP | 2006-140213 | 6/2006 |
| JP | 2006-294666 | 10/2006 |
| JP | 4021472 B1 | 10/2007 |
| JP | 4024846 B1 | 10/2007 |
| JP | 2008-131040 | 6/2008 |
| JP | 2008-140941 | 6/2008 |
| TW | 200812462 A | 3/2008 |
| WO | 2008/050399 A1 | 5/2008 |

OTHER PUBLICATIONS

U.S. Appl. No. 12/403,220, filed Mar. 12, 2009, Takahashi, et al.
U.S. Appl. No. 12/496,141, filed Jul. 1, 2009, Takahashi.

* cited by examiner

*Primary Examiner* — William H Mayo, III
*Assistant Examiner* — Hiram E Gonzalez
(74) *Attorney, Agent, or Firm* — Oblon, Spivak, McClelland, Maier & Neustadt, L.L.P.

(57) ABSTRACT

A flex-rigid wiring board including a rigid substrate including a rigid base material and a conductor layer, and a flexible substrate having a conductor layer. The conductor layer of the flexible substrate is electrically connected to the conductor layer of the rigid substrate. The rigid substrate has a recessed portion which is formed on a surface of the rigid substrate and which accommodates an electronic component.

16 Claims, 21 Drawing Sheets

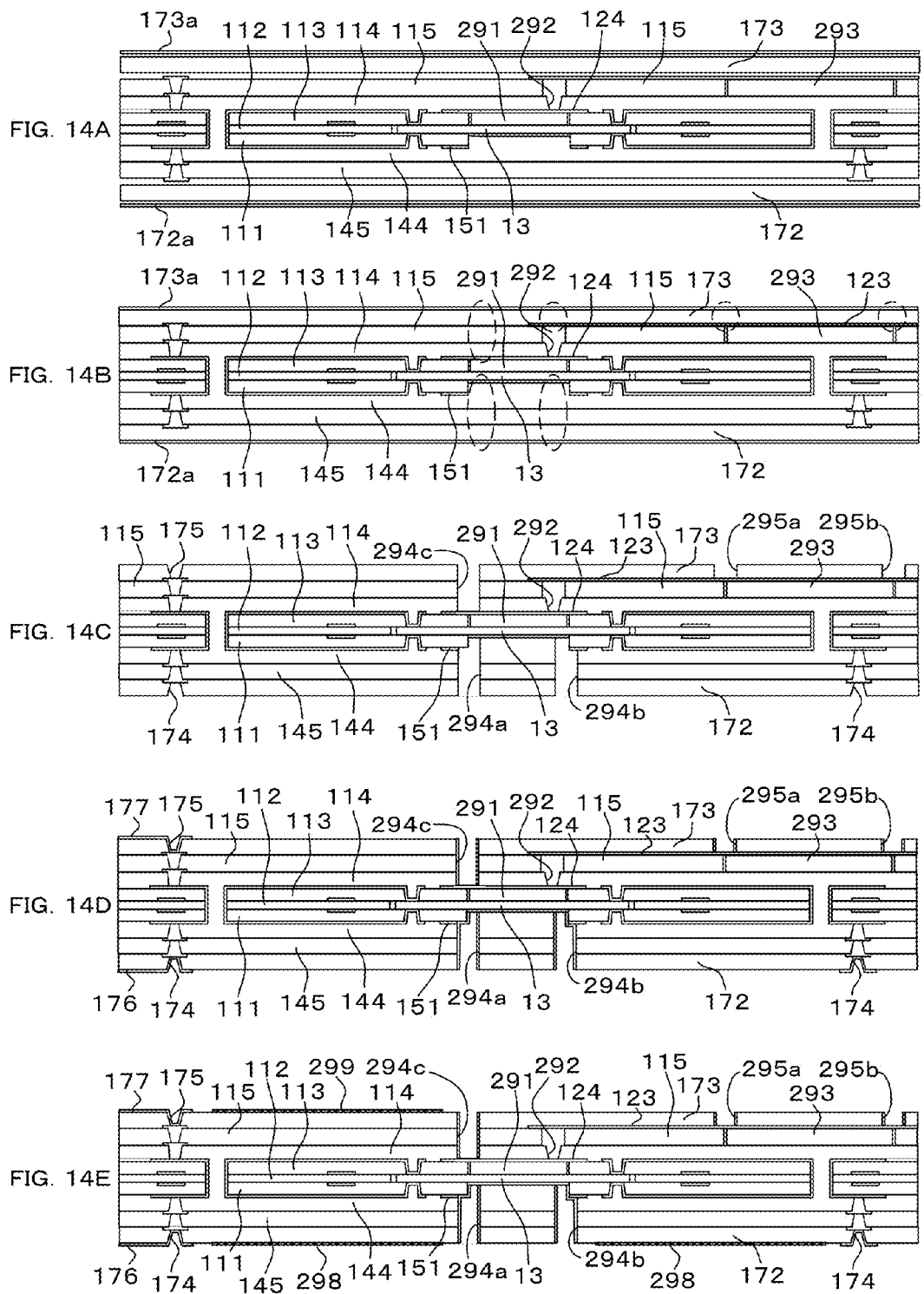

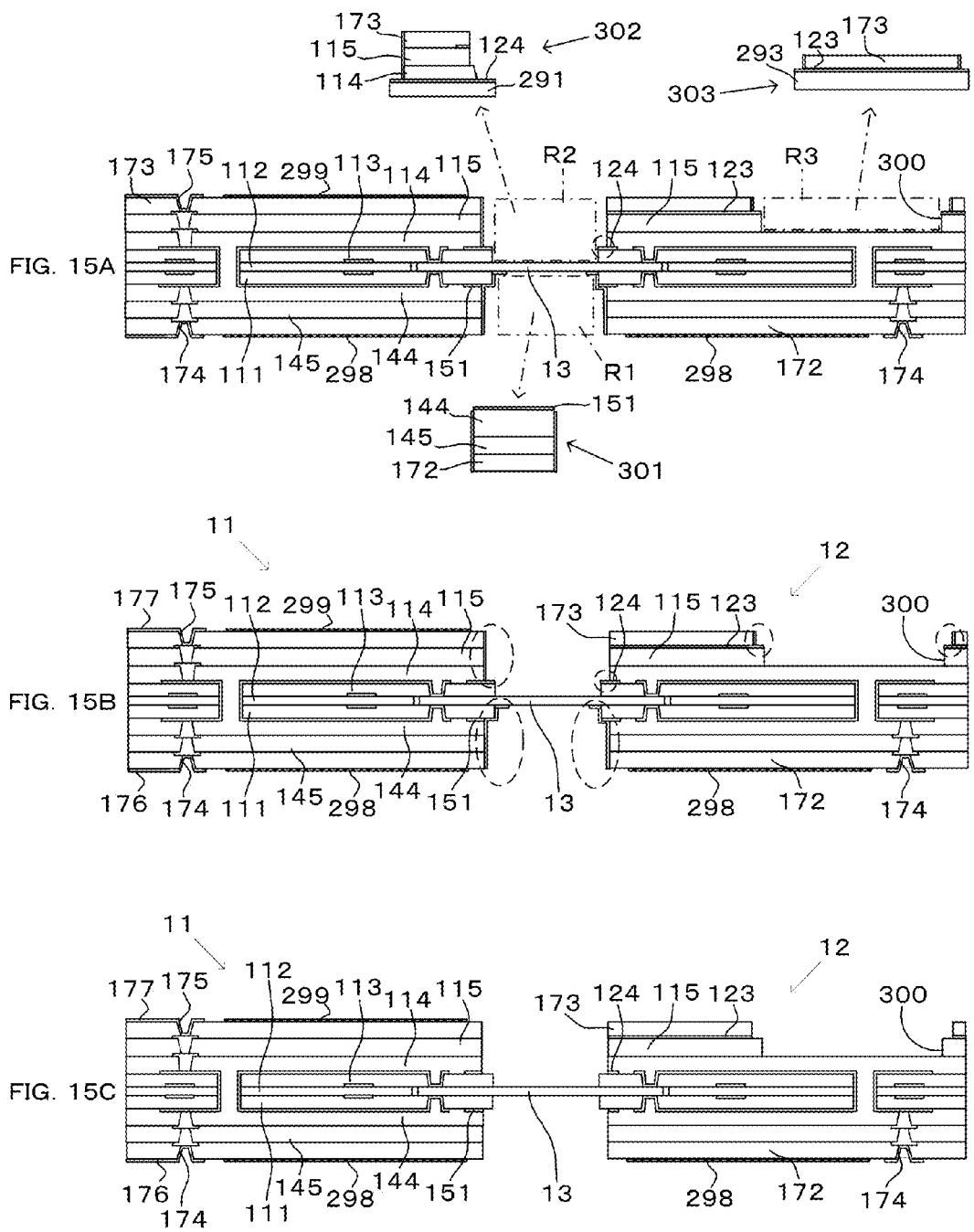

FLEX-RIGID WIRING BOARD AND METHOD FOR MANUFACTURING THE SAME

CROSS-REFERENCE TO RELATED APPLICATIONS

The present application claims the benefits of priority to U.S. Application No. 61/084,685, filed Jul. 30, 2008. The contents of that application are incorporated herein by reference in their entirety.

BACKGROUND OF THE INVENTION

1. Field of the Invention

The present invention is related to a bendable flex-rigid wiring board, part of which is formed with a flexible substrate, and to its manufacturing method.

2. Discussion of the Background

In Japanese Patent Publication 2006-140213, the following is described: a flex-rigid wiring board having a core substrate in a rigid-section; a flexible substrate arranged horizontally next to the core substrate; a flexible adhesive layer laminated on the core substrate and the flexible substrate; a wiring pattern formed on the flexible adhesive layer that is positioned on the rigid section; and a blind via and/or a through-hole that connect wiring patterns formed on each layer. The contents of this publication are incorporated herein by reference in their entirety.

SUMMARY OF THE INVENTION

According to one aspect of the present invention, a flex-rigid wiring board includes a rigid substrate including a rigid base material and a conductor layer, and a flexible substrate having a conductor layer. The conductor layer of the flexible substrate is electrically connected to the conductor layer of the rigid substrate. The rigid substrate has a recessed portion which is formed on a surface of the rigid substrate and which accommodates an electronic component.

According to another aspect of the present invention, a flex-rigid wiring board includes multiple rigid substrates each including a rigid base material and a conductor layer, and one or more flexible substrates each having a conductor layer. The conductor layer of the flexible substrate is electrically connected to the conductor layer of each of the rigid substrates. The plurality of rigid substrates has one or more recessed portions which are formed on a surface of one or more of the rigid substrates and which accommodate an electronic component.

According to yet another aspect of the present invention, a method for manufacturing a flex-rigid wiring board includes forming a rigid substrate including a rigid base material, a separator provided over the rigid base material, and multiple insulation layers laminated over the rigid base material after the separator is provided, removing the separator together with a portion of the multiple insulation layers after the laminating of the insulation layers, and forming a recessed portion, which accommodates an electronic component according to a shape of the separator, on a surface of the rigid substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 14A is a view illustrating a step to form a fourth layer;

FIG. 14B is a view illustrating a step to form a fourth layer;

FIG. 14C is a view illustrating a step to form a fourth layer;

FIG. 14D is a view illustrating a step to form a fourth layer;

FIG. 14E is a view illustrating a step to form a fourth layer;

FIG. 15A is a view illustrating a step to form recessed sections;

FIG. 15B is a view showing a stage after the recessed sections have been formed;

FIG. 15C is a view showing a stage after the copper that remained when forming the recessed sections;

DETAILED DESCRIPTION OF THE PREFERRED EMBODIMENTS

Figure 1A:
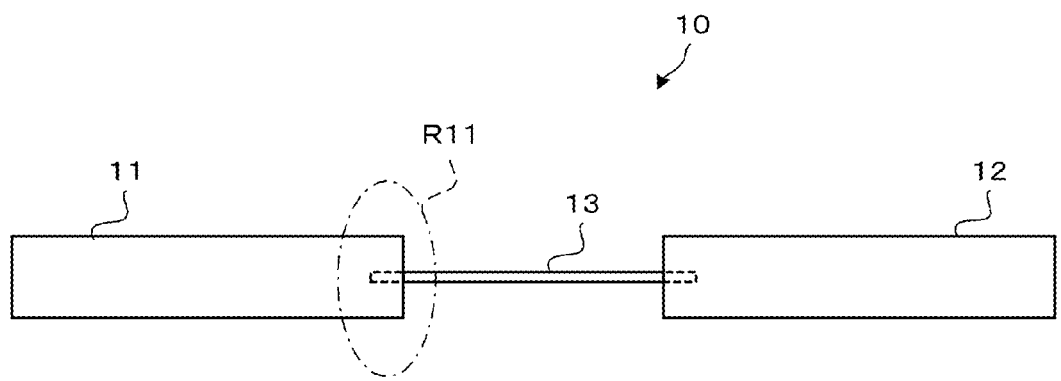
FIG. 1A is a side view of a flex-rigid wiring board according to an embodiment of the present invention.

The embodiments will now be described with reference to the accompanying drawings, wherein like reference numerals designate corresponding or identical elements throughout the various drawings.

Figure 1B:
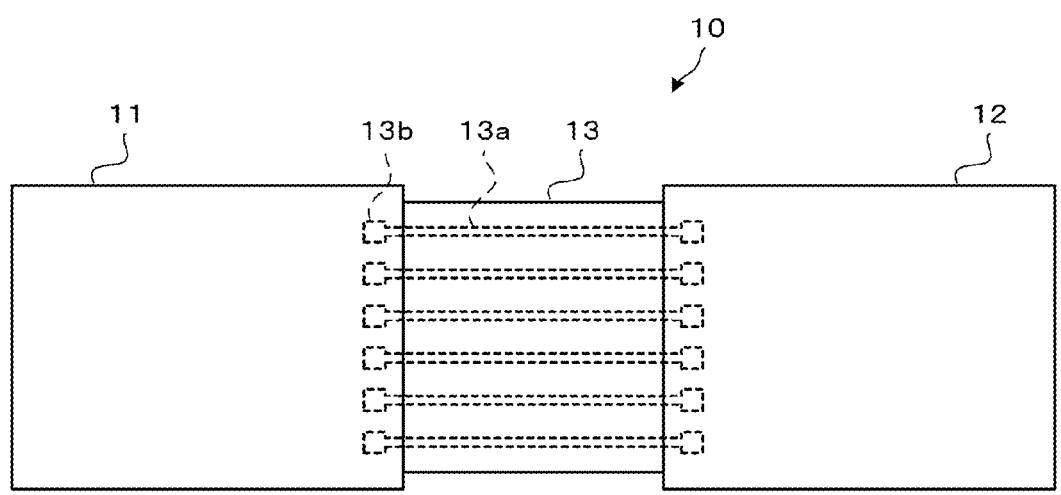
FIG. 1B is a plan view of a flex-rigid wiring board according to an embodiment of the present invention.

As shown in FIGS. 1A and 1B, flex-rigid wiring board 10 according to the present embodiment is made up of first rigid substrate 11, second rigid substrate 12 and flexible substrate 13; first rigid substrate 11 and second rigid substrate 12 face each other and sandwich flexible substrate 13. More specifically, first and second rigid substrates 11, 12 are arranged horizontal to flexible substrate 13.

In each of first and second rigid substrates 11, 12, a circuit pattern of any type is formed, and electronic components such as semiconductor chips or the like are connected according to requirements. Meanwhile, in flexible substrate 13, striped wiring pattern (13a) is formed to connect a circuit pattern of first rigid substrate 11 and a circuit pattern of second rigid substrate 12. Wiring pattern (13a) connects circuit patterns of rigid substrates 11, 12 to each other.

Figure 2:
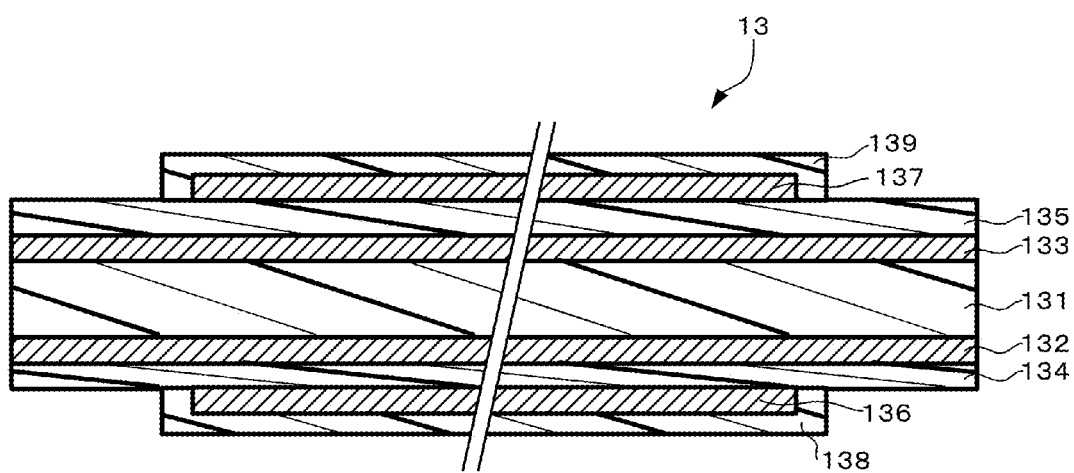
FIG. 2 is a cross-sectional view of a flexible substrate.

Flexible substrate 13 has, as its detailed structure is shown in FIG. 2, a structure made by laminating base material 131, conductive layers 132, 133, insulation films 134, 135, shield layers 136, 137 and coverlays 138, 139.

Base material 131 is formed with an insulative flexible sheet, for example, a polyimide sheet, with a thickness in the range of 20-50 µm, preferably with an approximate thickness of 30 µm.

Conductive layers 132, 133 are made of a copper pattern with an approximate thickness of 5-15 µm; they are formed on the front and back, respectively, of base material 131 to structure the above-described striped wiring pattern (13a) (FIG. 1B).

Insulation films 134, 135 are made with a polyimide film or the like with an approximate thickness of 5-15 µm, and insulate conductive layers 132, 133 from the outside.

Shield layers 136, 137 are made with a conductive layer, for example, a cured silver paste film, and shield conductive layers 132, 133 from external electromagnetic noise, and shield the electromagnetic noise from conductive layers 132, 133 from going outside.

Coverlays 138, 139 are made with an insulative film such as polyimide with an approximate thickness of 5-15 µm; they insulate and protect the entire flexible substrate 13 from the outside.

Figure 3:
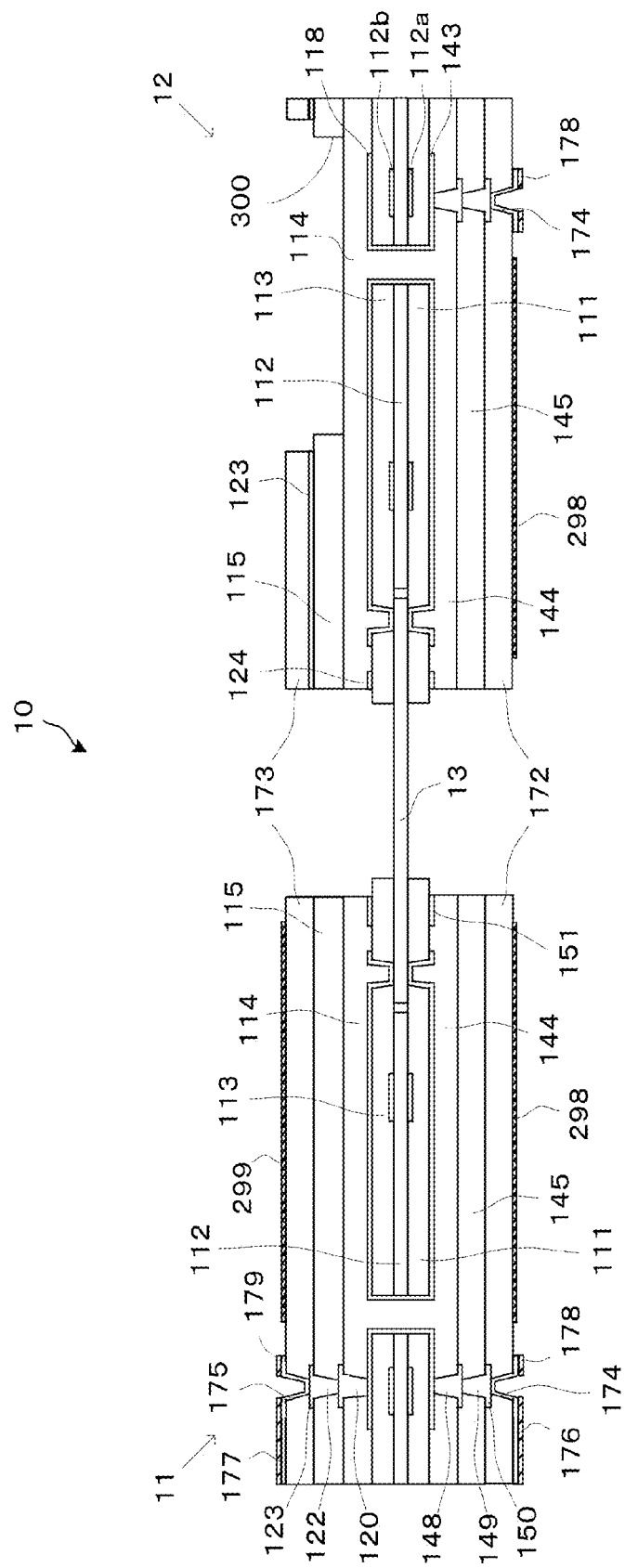
FIG. 3 is a cross-sectional view of a flex-rigid wiring board.

On the other hand, rigid substrates 11, 12, as is shown in FIG. 3, each are formed by laminating rigid base material 112, first and second insulation layers 111, 113, first and second upper-layer insulation layers 144, 114, third and fourth upper-layer insulation layers 145, 115, and fifth and sixth upper-layer insulation layers 172, 173.

Rigid base material 112 provides rigidity for rigid substrates 11, 12 and is formed with a rigid insulative material such as glass epoxy resin. Rigid base material 112 is arranged horizontal to flexible substrate 13 without touching it. Rigid base material 112 has substantially the same thickness as flexible substrate 13. Also, on the front and back of rigid base material 112, conductive patterns (112a, 112b) made of copper, for example, are formed respectively. Conductive patterns (112a, 112b) are each electrically connected to a further upper-layer conductor (wiring) at a predetermined spot.

First and second insulation layers 111, 113 are formed by curing a prepreg. First and second insulation layers 111, 113 each have a thickness in the range of 50-100 µm, preferably an approximate thickness of 50 µm. The prepreg is preferred to contain a resin with low-flow characteristics. Such a prepreg may be formed by impregnating a glass cloth with epoxy resin and by thermosetting the resin beforehand to advance its degree of curing. However, such a prepreg may also be made by impregnating a glass cloth with a highly viscous resin, or by impregnating a glass cloth with inorganic filler (such as silica filler), or by reducing the resin amount to be impregnated in a glass cloth.

Figure 4:
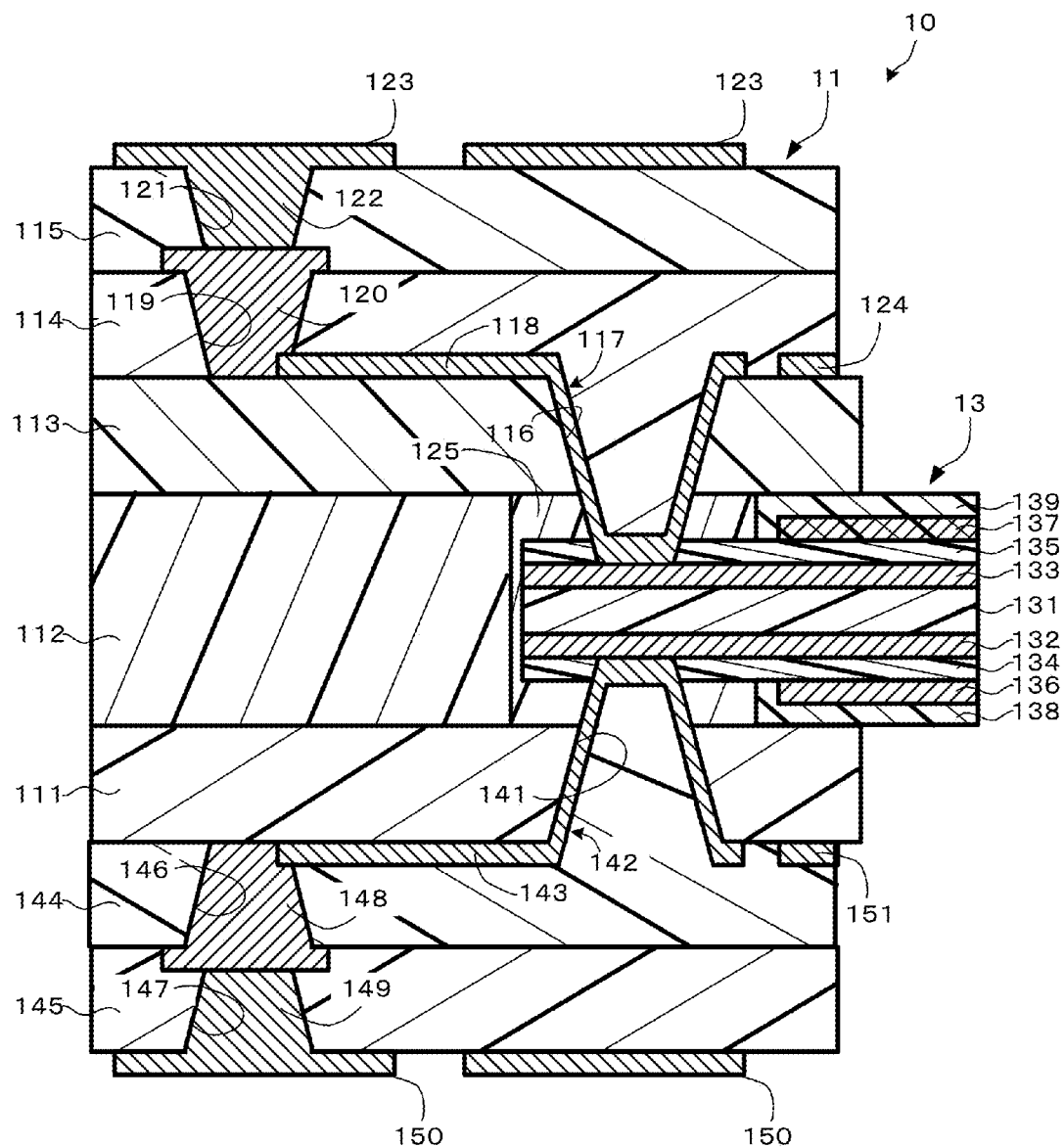
FIG. 4 is a partially magnified view of FIG. 1A.

Rigid base material 112 and first and second insulation layers 111, 113 form the core for rigid substrates 11, 12 and support rigid substrates 11, 12; they also support and anchor flexible substrate 13 by sandwiching its tips. Specifically, as FIG. 4 shows a magnified view of region (R11) (the connected section between first rigid substrate 11 and flexible substrate 13) shown in FIG. 1A, first and second insulation layers 111, 113 cover rigid base material 112 and flexible substrate 13 from the top and back sides while exposing part of flexible substrate 13. First and second insulation layers 111, 113 are polymerized with coverlays 138, 139 formed on the surfaces of flexible substrate 13.

The structure of the connection section between rigid substrate 12 and flexible substrate 13 is the same as the structure (FIG. 4) of the connection section between rigid substrate 11 and flexible substrate 13. Therefore, the detailed description of the connection section of rigid substrate 12 is omitted here.

In the spaces (gaps among such members) sectioned off by rigid base material 112, flexible substrate 13 and first and second insulation layers 111, 113, resin 125 is filled as shown in FIG. 4. Resin 125 is a kind of resin, for example, that seeps from the low-flow prepreg which forms first and second insulation layers 111, 113 during the manufacturing process and is cured to be integrated with first and second insulation layers 111, 113.

At the portions of first and second insulation layers 111, 113 facing connection pads (13b) on conductive layers 132, 133 of flexible substrate 13, vias (contact holes) 141, 116 are formed respectively. From each portion of flexible substrate 13 facing vias 141, 116 (the portion where connection pad (13b) is formed as shown in FIG. 1B), shield layers 136, 137 and coverlays 138, 139 of flexible substrate 13 are removed. Vias 141, 116 penetrate insulation films 134, 135 of flexible substrate 13 respectively, and expose each connection pad (13b) formed from conductive layers 132, 133.

On each inner surface of vias 141, 116, wiring patterns (conductive layers) 142, 117 are each formed with copper plating or the like. The plated films of wiring patterns 142, 117 are connected respectively to connection pads (13b) on conductive layers 132, 133 of flexible substrate 13. In vias 141, 116, resin is filled. The resin in vias 141, 116 is filled by being squeezed from the upper-layer insulation layers (upper-layer insulation layers 144, 114) by pressing, for example. Furthermore, on each top surface of first and second insulation layers 111, 113, extended patterns 143, 118, which are connected to wiring patterns 142, 117, are formed respectively. Extended patterns 143, 118 are each formed with, for example, a copper-plated layer. Also, at the tips of first and second insulation layers 111, 113 on the side of flexible substrate 13, namely, at the areas of flexible substrate 13 that are positioned outside the boundary between flexible substrate 13 and rigid base material 112, conductive patterns 151, 124 insulated from the rest are arranged respectively. Heat generated in rigid substrate 11 is effectively radiated through conductive patterns 151, 124.

As described so far, in flex-rigid wiring board 10 according to the present embodiment, rigid substrates 11, 12 and flexible substrate 13 are electrically connected without using connectors. Namely, flexible substrate 13 is inserted (embedded) in rigid substrates 11, 12 respectively, and flexible substrate 13 is electrically connected to each rigid substrate at the inserted portion (embedded portion) (see FIG. 4). Accordingly, even when an impact from being dropped or the like is exerted, poor connection due to disconnected connectors will not occur.

Also, since part of the flexible substrate is embedded in a rigid substrate, the rigid substrate adheres to and reinforces both the top and bottom surfaces of the portion where the flexible substrate and the rigid substrate are electrically connected. Therefore, when the flex-rigid wiring board receives an impact from being dropped, or when stress is generated due to the different coefficients of thermal expansion (CTE) in the rigid substrate and the flexible substrate caused by changes in ambient temperature, the electrical connection between the flexible substrate and the rigid substrate may be maintained.

In this sense, flex-rigid wiring board 10 features highly reliable electrical connection, compared with a substrate where connection is achieved through connectors.

In addition, conductive layers 132, 133 of flexible substrate 13 and wiring patterns 142, 117 of rigid substrates 11, 12 are connected through taper-shaped vias. Thus, compared with a connection by means of through-holes which extend in a direction that makes a right angle to the substrate surface, stresses exerted from impact may be dispersed and thus cracks or the like may seldom occur. Moreover, since conductive layers 132, 133 and wiring patterns 142, 117 are connected through plated films, reliability at the connected areas is high. Besides, resin is filled in vias 141, 116, further increasing connection reliability.

On the top surfaces of first and second insulation layers 111, 113, first and second upper-layer insulation layers 144, 114 are laminated respectively. In first and second upper-layer insulation layers 144, 114, vias (first upper-layer vias) 146, 119 connected to extended patterns 143, 118 are formed respectively. In addition, vias 146, 119 are filled respectively with conductors 148, 120 made of copper, for example. First and second upper-layer insulation layers 144, 114 are formed by curing a prepreg made, for example, by impregnating glass cloth with resin.

On the top surfaces of first and second upper-layer insulation layers 144, 114, third and fourth upper-layer insulation layers 145, 115 are laminated respectively. Third and fourth upper-layer insulation layers 145, 115 are also formed by curing a prepreg made, for example, by impregnating glass cloth with resin. In third and fourth upper-layer insulation layers 145, 115, vias (second upper-layer vias) 147, 121 connected to vias 146, 119 are formed respectively. Vias 147, 121 are filled respectively with conductors 149, 122 made of copper, for example. Conductors 149, 122 are electrically connected to conductors 148, 120 respectively. Accordingly, filled build-up vias are formed by vias 146, 147, 119, 121.

On the top surfaces of third and fourth upper-layer insulation layers 145, 115, conductive patterns (circuit patterns) 150, 123 are formed respectively. Then, by connecting vias 147, 121 to predetermined spots of conductive patterns 150, 123 respectively, conductive layer 133 and conductive pattern 123 are electrically connected through wiring pattern 117, extended pattern 118, conductor 120 and conductor 122; and conductive layer 132 and conductive pattern 150 are electrically connected through wiring pattern 142, extended pattern 143, conductor 148 and conductor 149.

On the top surfaces of third and fourth upper-layer insulation layers 145, 115, fifth and sixth upper-layer insulation layers 172, 173 are further laminated respectively as shown in FIG. 3. Fifth and sixth upper-layer insulation layers 172, 173 are also formed by curing a prepreg made, for example, by impregnating glass cloth with resin.

In fifth and sixth upper-layer insulation layers 172, 173, vias 174, 175 connected to vias 147, 121 are formed respectively. On the top and bottom of the substrate including the interiors of vias 174, 175, conductive patterns 176, 177 made of copper, for example, are formed respectively. Conductive patterns 176, 177 are electrically connected to conductors 149, 122 respectively. Moreover, on the top and bottom of the substrate, patterned solder resists 298, 299 are arranged. Electrodes 178, 179 are formed, for example, by chemical gold plating at each predetermined spot in conductive patterns 176, 177.

In addition, on a surface of flex-rigid wiring board 10, specifically, on a surface of rigid substrate 12, recessed section (cavity) 300 is formed having predetermined dimensions (length, width and depth), for example, a size that allows electronic components such as an IC (integrated circuit) chip to be accommodated. By forming such recessed section 300 on a surface of the substrate, a space is created in recessed section 300 that may be used in any way. In such a space, for example, a component may be arranged—a component to be electrically connected to flex-rigid wiring board 10, or a component to be electrically connected to another substrate. Accordingly, when flex-rigid wiring board 10 is used, for example, as a substrate in a cell phone, it may contribute to making a thinner type of the phone body itself or a multifunctional type. However, the space in recessed section 300 may be used for any purpose; for example, another use such as conducting alignments by using different levels may be employed.

When manufacturing flex-rigid wiring board 10, flexible substrate 13 (FIG. 2) is manufactured first. Specifically, a copper film is formed on both surfaces of polyimide base material 131 prepared to be a predetermined size. In the following, by patterning the copper films, conductive layers 132, 133 are formed that have wiring patterns (13a) and connection pads (13b). Then, on each surface of conductive layers 132, 133, insulation films 134, 135 made of polyimide, for example, are formed through a laminating process. Furthermore, after silver paste is applied on insulation films 134, 135 except for the tips of flexible substrate 13, the silver paste is cured to form shield layers 136, 137. Then, coverlays 138, 139 are formed to cover each surface of shield layers 136, 137. Here, shield layers 136, 137 and coverlays 138, 139 are formed to avoid connection pads (13b).

Figure 5:
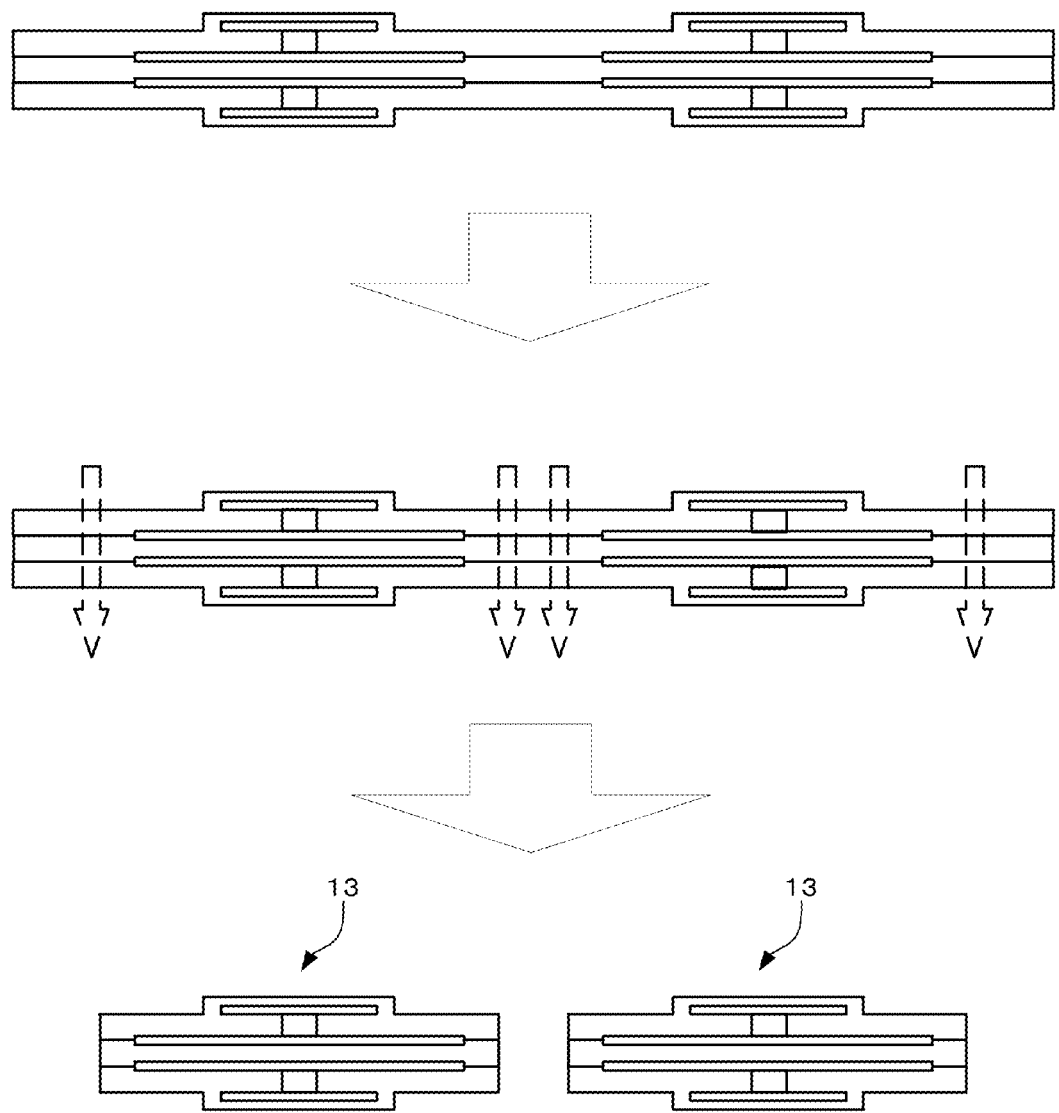
FIG. 5 shows views illustrating steps to cut out flexible substrates from a wafer commonly used for multiple products.

Through such a series of steps, a wafer having a laminated structure shown in FIG. 2 is completed. Such a wafer is used as a material commonly used for multiple products. Namely, as shown in FIG. 5, by cutting the wafer into a predetermined size using a laser or the like, flexible substrate 13 of a predetermined size is obtained.

Figure 6:
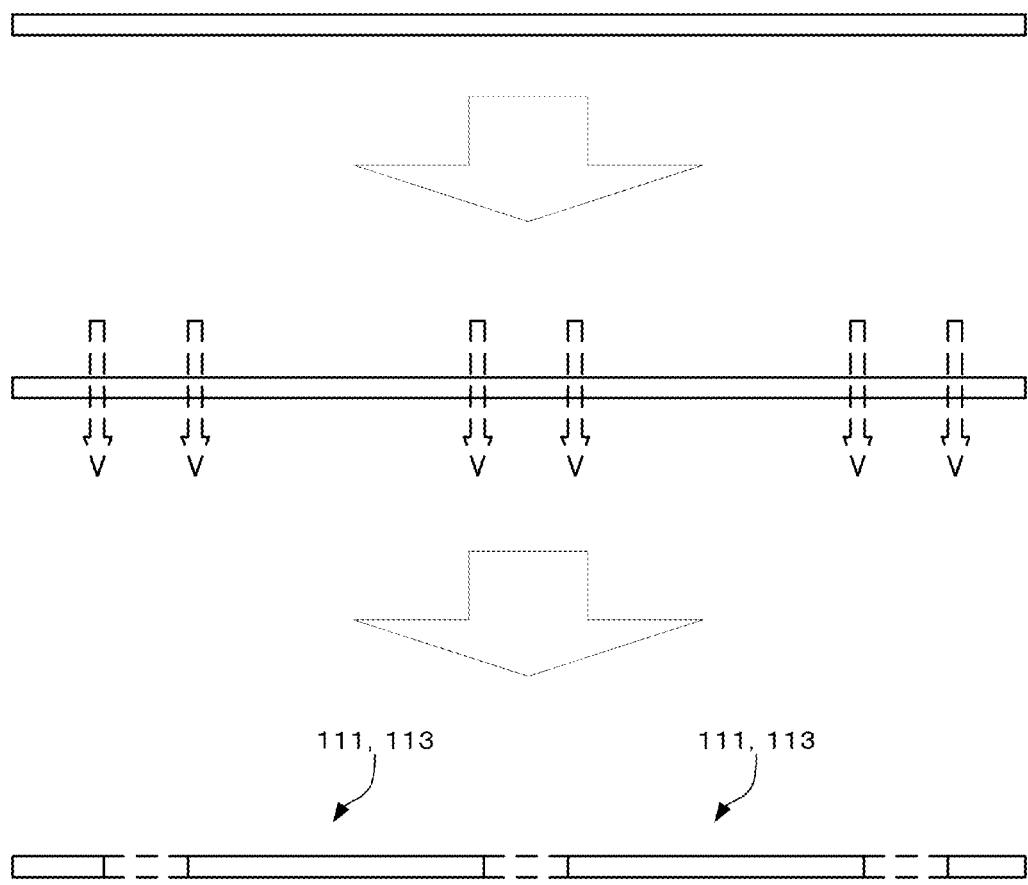
FIG. 6 shows views illustrating steps to cut out a first and a second insulation layers from a wafer commonly used for multiple products.
Figure 7:
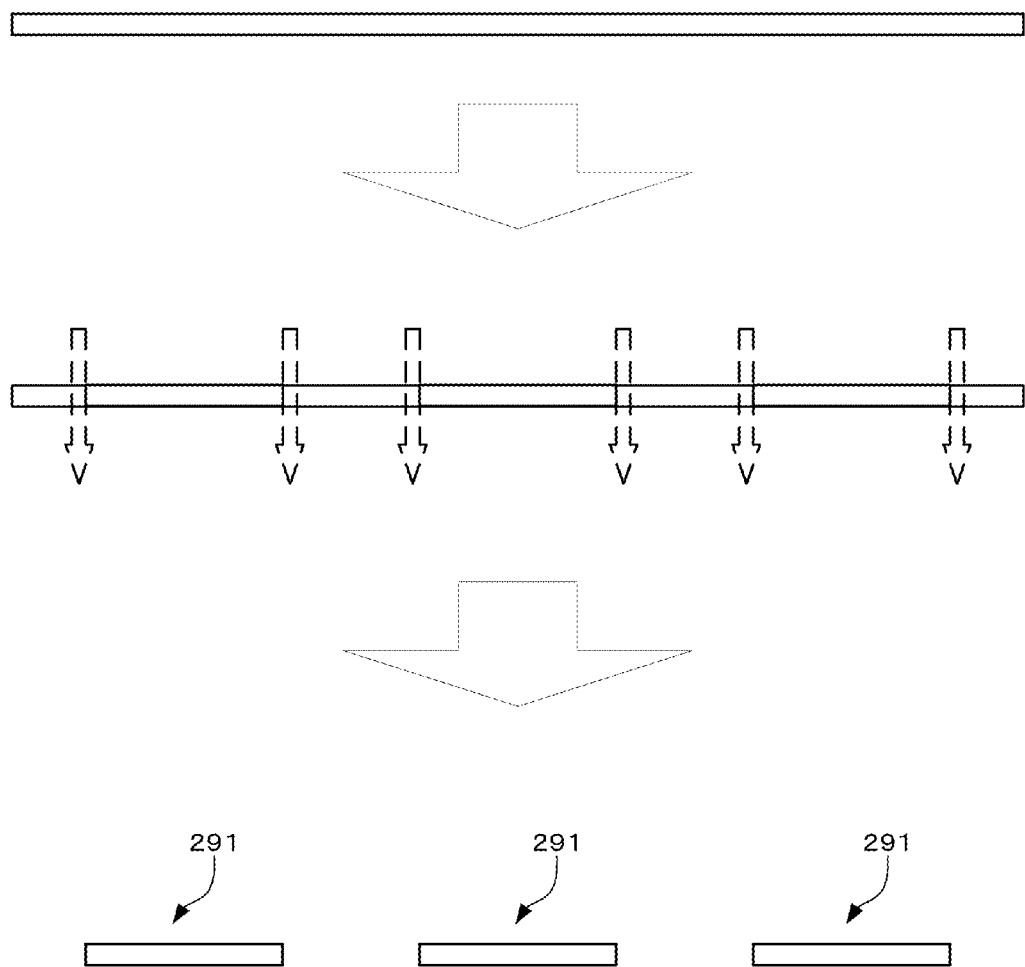
FIG. 7 shows views illustrating steps to cut out separators from a wafer commonly used for multiple products.

Next, flexible substrate 13 as manufactured above is bonded with each rigid substrate of first and second rigid substrates 11, 12. Before bonding, as shown in FIG. 6, for example, first and second insulation layers 111, 113 of a predetermined size are prepared by cutting a wafer commonly used for multiple products using a laser or the like. Also, as shown in FIG. 7, for example, separators 291 of a predetermined size are prepared by cutting a wafer commonly used for multiple products by a laser or the like.

Figure 8:
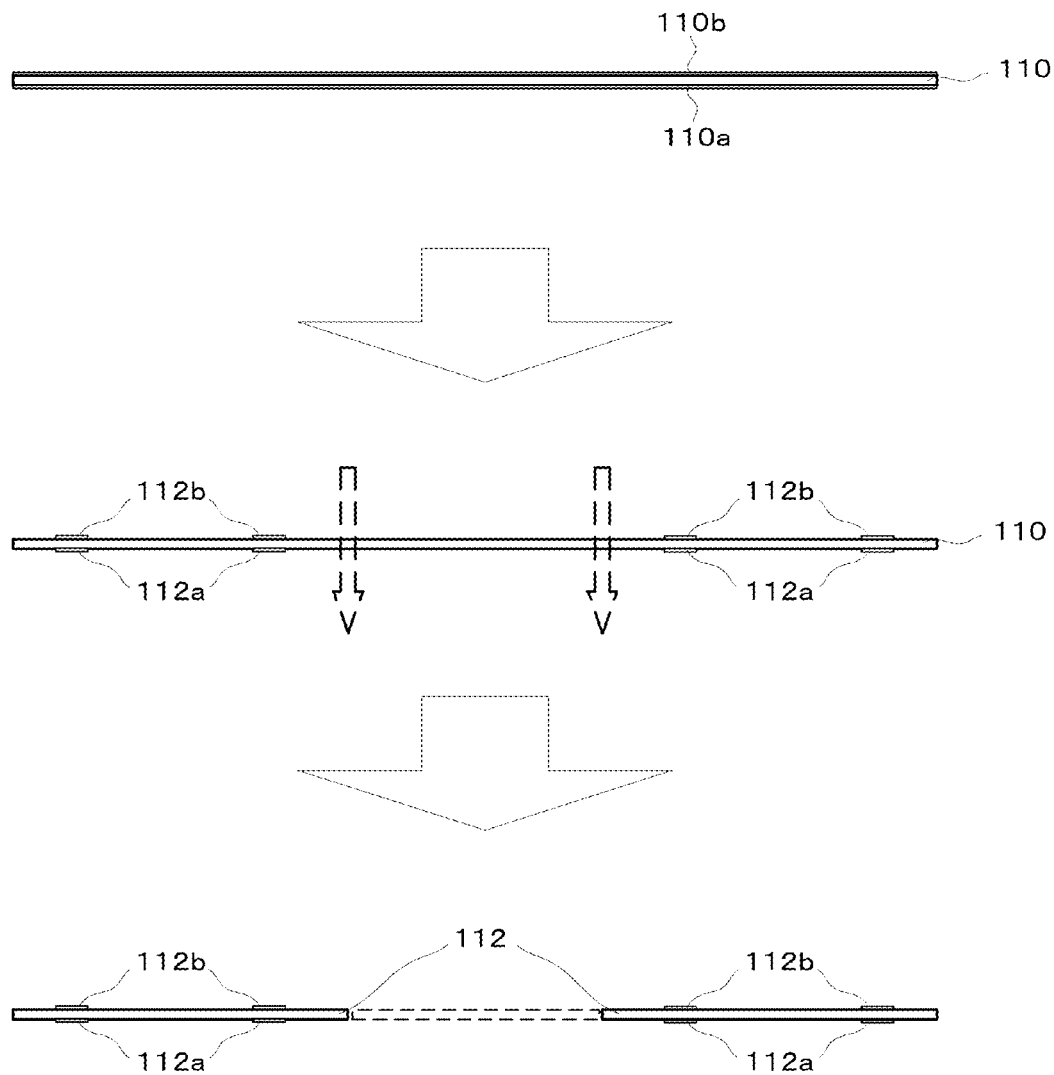
FIG. 8 shows views illustrating steps to form cores for rigid substrates.

Also, rigid base material 112 that makes the core for rigid substrates 11, 12 is produced from wafer 110 commonly used for multiple products as shown in, for example, FIG. 8. Namely, after conductive films (110a, 110b) made of copper, for example, are formed on the top and bottom of wafer 110 respectively, conductive films (110a, 110b) are patterned to form conductive patterns (112a, 112b) through, for example, a predetermined lithography process (pretreatment, laminating, exposing to light, developing, etching, removing the film, inspecting inner layers and so forth). Then, using a laser or the like, a predetermined portion of wafer 110 is removed to obtain rigid base materials 112 for rigid substrates 11, 12. After that, the surfaces of the conductive patterns of rigid base material 112 as manufactured above are treated to make roughened surfaces.

Rigid base material 112 is formed, for example, with glass-epoxy base material of a thickness in the range of 50-150 μm, preferably an approximate thickness of 100 μm; first and second insulation layers 111, 113 are formed, for example, with a prepreg of a thickness in the range of 20-50 μm. Separator 291 is formed, for example, with a cured prepreg or polyimide film or the like. The thicknesses of first and second insulation layers 111, 113 are set at substantially the same thickness to make, for example, a symmetrical structure on the top and bottom of rigid substrates 11, 12. The thickness of separator 291 is set to be substantially the same thickness as that of second insulation layer 113. Also, the thickness of rigid base material 112 and the thickness of flexible substrate 13 are preferred to be made substantially the same. By doing so, resin 125 will be filled in spaces formed between rigid base material 112 and coverlays 138, 139. Accordingly, flexible substrate 13 and rigid base material 112 may be bonded more securely.

Figure 10A:
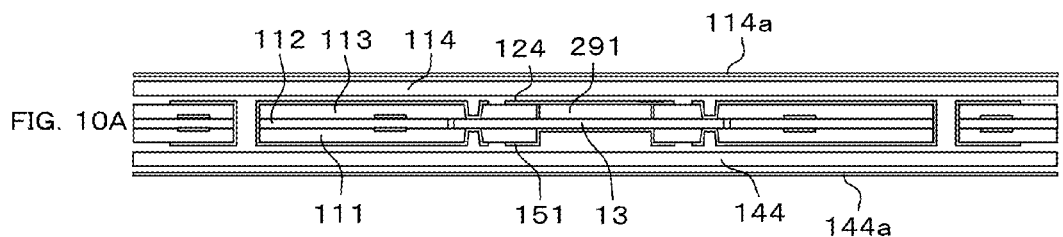
FIG. 10A is a view illustrating a step to form a second layer.

In the following, first and second insulation layers 111, 113, rigid base materials 112 and flexible substrate 13 that were cut in the process shown in FIGS. 5, 6 and 8 are aligned and arranged, for example, as shown in FIG. 10A. During that time, each tip of flexible substrate 13 is sandwiched between first and second insulation layers 111, 113 and then aligned.

Figure 9A:
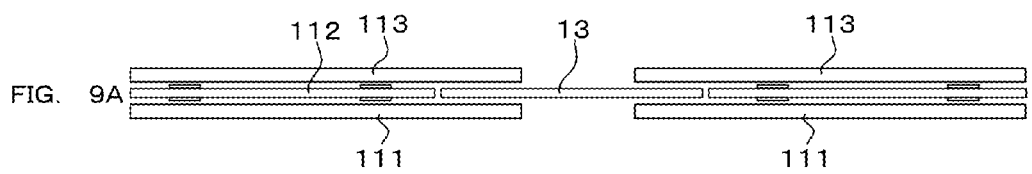
FIG. 9A is a view illustrating a step to form a first layer.
Figure 9B:
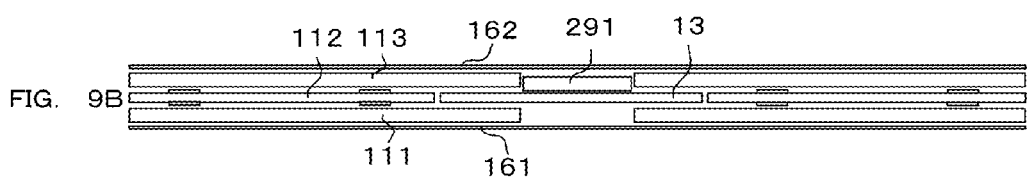
FIG. 9B is a view illustrating a step to form a first layer.

Furthermore, as shown in FIG. 9B, for example, separator 291 that was cut in the step shown in FIG. 7 is arranged side by side with second insulation layer 113 on one surface (for example, the upper surface) of flexible substrate 13, which is exposed between rigid substrate 11 and rigid substrate 12. Then, conductive films 161, 162 made of copper, for example, are disposed on the outside (both top and bottom). Separator 291 is secured using, for example, an adhesive agent. By making such a structure, since separator 291 supports conductive film 162, problems such as broken copper foil caused by a plating solution that is seeped into the space between flexible substrate 13 and conductive film 162 may be prevented or suppressed.

Figure 9C:
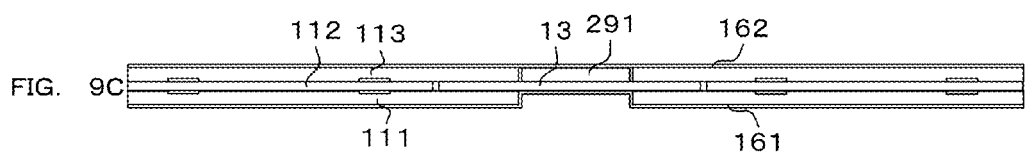
FIG. 9C is a view illustrating a step to form a first layer.

Next, the structure, as so aligned (FIG. 9B), is pressure-pressed as shown, for example, in FIG. 9C. During that time, resin 125 is squeezed from each prepreg that forms first and second insulation layers 111, 113. As shown in FIG. 4, the space between rigid base material 112 and flexible substrate 13 is filled by resin 125. As such, by filling the space with resin 125, flexible substrate 13 and rigid base material 112 are adhered securely. Such pressure-pressing is conducted using, for example, hydraulic pressing equipment, under the approximate conditions of temperature at 200° C., pressure at 40 kgf and pressing time of three hours.

In the following, the entire structure is heated or the like, and the prepreg forming first and second insulation layers 111, 113 and resin 125 are cured and integrated. At that time, coverlays 138, 139 (FIG. 4) of flexible substrate 13 and the resin of first and second insulation layers 111, 113 are polymerized. By polymerizing the resin of insulation layers 111, 113, the surroundings of vias 141, 116 (they will be formed in the later process) are secured with resin, thus enhancing connection reliability of each connection section between via 141 and conductive layer 132 (or between via 116 and conductive layer 133).

Figure 9D:
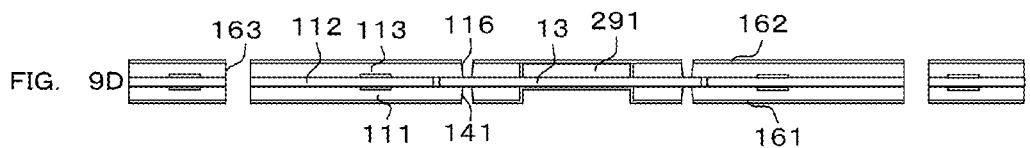
FIG. 9D is a view illustrating a step to form a first layer.

Next, after a predetermined pretreatment, for example, a $CO_2$ laser is beamed using $CO_2$ laser processing equipment to form through-holes 163 as shown in FIG. 9D. During that time, vias 116, 141 (for example, IVHs (Interstitial Via Holes)) are also formed to connect conductive layers 132, 133 of flexible substrate 13 (FIG. 4) and rigid substrates 11, 12 respectively.

Figure 9E:
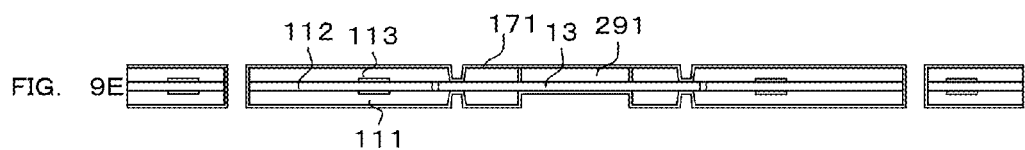
FIG. 9E is a view illustrating a step to form a first layer.

In the following, after conducting desmear treatment (removing smears) and soft etching, for example, as shown in FIG. 9E, PN plating (for example, chemical copper plating and electrical copper plating) is performed to plate copper on the entire surfaces of the structure. The copper from such copper plating and already existing conductive films 161, 162 are integrated to form copper films 171 on the entire surfaces of the substrate including the inner surfaces of vias 116, 141 and the inner surfaces of through-holes 163. During that time, since flexible substrate 13 is covered by conductive films 161, 162, it is not directly exposed to the plating solution. Therefore, flexible substrate 13 will not be damaged by the plating solution.

Figure 9F:
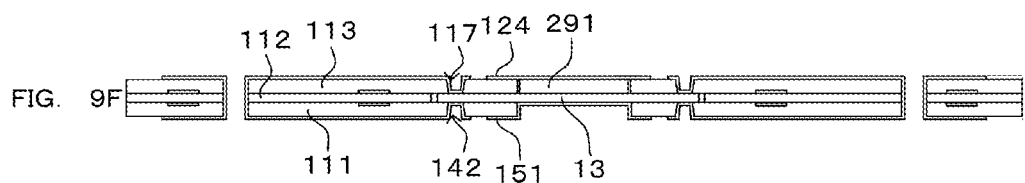
FIG. 9F is a view illustrating a step to form a first layer.

In the following, copper films 171 on the surfaces of the substrate are patterned, for example, as shown in FIG. 9F, through a predetermined lithography process (pretreatment, laminating, exposing to light, developing, etching, removing the film, inspecting inner layers and so forth). By doing so, wiring patterns 142, 117, extended patterns 143, 118 and conductive patterns 151, 124 are further formed to be connected to conductive layers 132, 133 of flexible substrate 13 (FIG. 4) respectively. At that time, copper foil is kept on each tip of first and second insulation layers 111, 113 on the side of flexible substrate 13. After that, the surfaces of the copper foils are treated to make roughened surfaces.

Figure 10B:
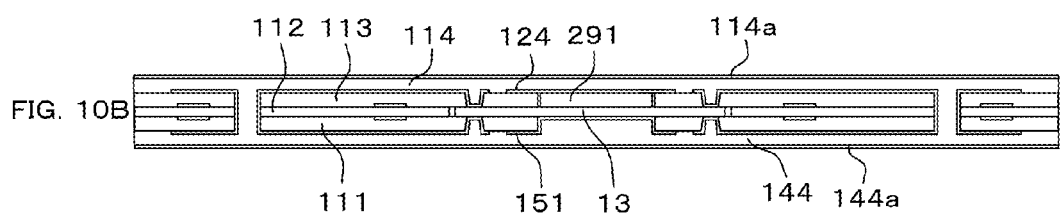
FIG. 10B is a view illustrating a step to form a second layer.

In the following, as shown in FIG. 10A, for example, on the top and bottom of the resultant structure, first and second upper-layer insulation layers 144, 114 are disposed respectively. Then, conductive films (114a, 144a) made of copper, for example, are further disposed outside those layers. After that, as shown in FIG. 10B, the structure is pressure-pressed. At that time, vias 116, 141 are filled with the resin squeezed from the prepreg, each forming first and second upper-layer insulation layers 114, 144. Then, the prepreg and the resin in the vias are set through thermal treatment or the like to cure first and second upper-layer insulation layers 144, 114.

Figure 10C:
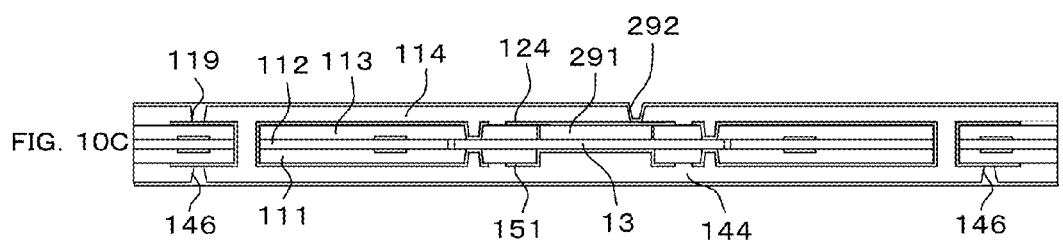
FIG. 10C is a view illustrating a step to form a second layer.

In the following, conductive films (114a, 144a) are made thinner to a predetermined thickness by half etching, for example. Then, after a predetermined pretreatment, using a laser, for example, vias 146 are formed in first upper-layer insulation layer 144, and vias 119 and cutoff line 292 are formed in second upper-layer insulation layer 114. Then, after conducting desmear treatment (removing smears) and soft etching, for example, as shown in FIG. 10C, conductors are formed in the interiors of vias 146, 119 and cutoff line 292 through PN plating (for example, chemical copper plating and electrical copper plating). Such conductors may also be formed by printing conductive paste (for example, thermosetting resin containing conductive particles) by screen printing.

Figure 10D:
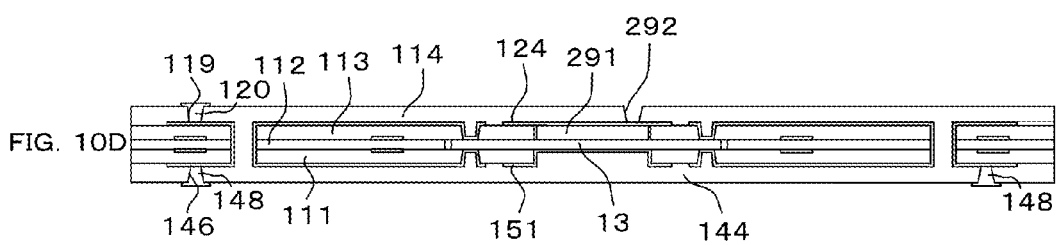
FIG. 10D is a view illustrating a step to form a second layer.

In the following, the conductive films on the surfaces of the substrate are made thinner to a predetermined thickness by half etching, for example. Then, the conductive films on the surfaces of the substrate are patterned through, for example, a predetermined lithography process (pretreatment, laminating, exposing to light, developing, etching, removing the film, inspecting inner layers and so forth) as shown in FIG. 10D. By doing so, conductors 148, 120 are formed. Also, the conductor in cutoff line 292 is removed by etching. After that, the surfaces of the conductors are treated to make roughened surfaces.

Figure 11:
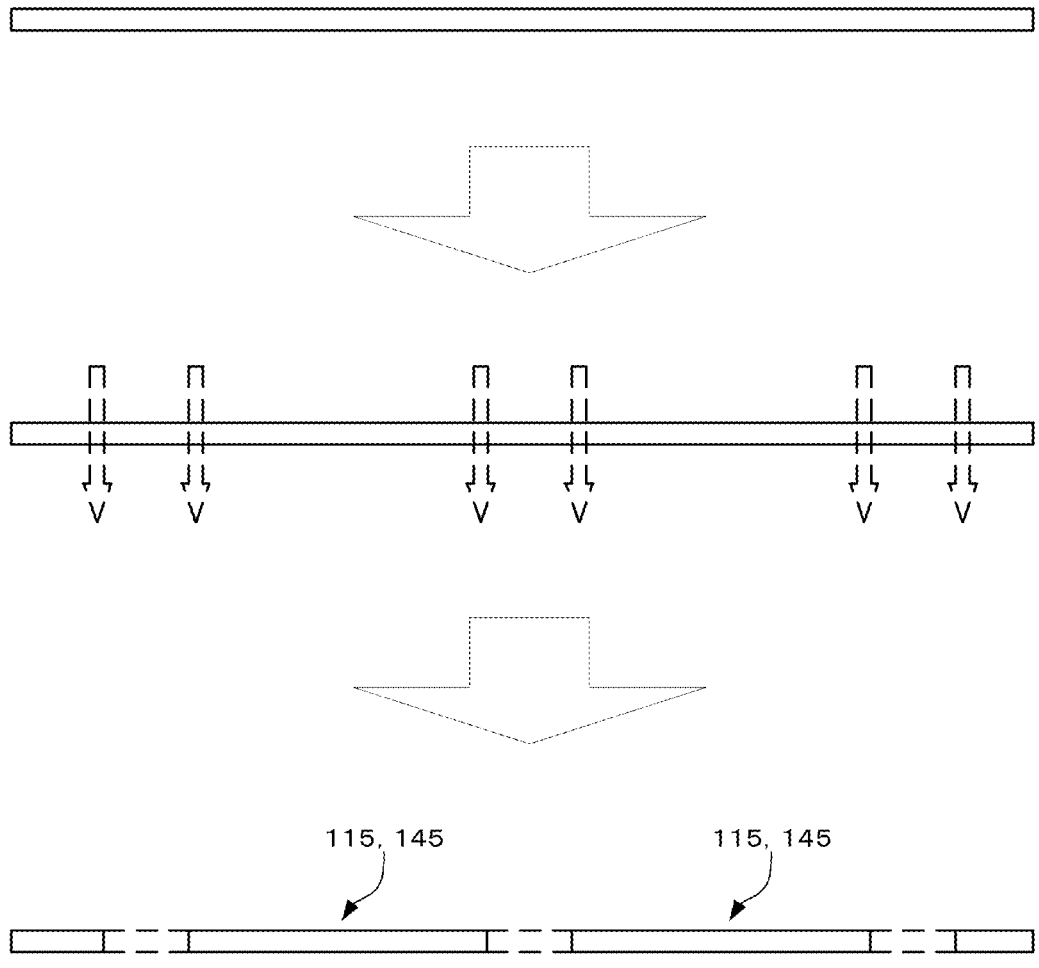
FIG. 11 shows views illustrating steps to cut out a third and a fourth upper-layer insulation layers from a wafer commonly used for multiple products.
Figure 12:
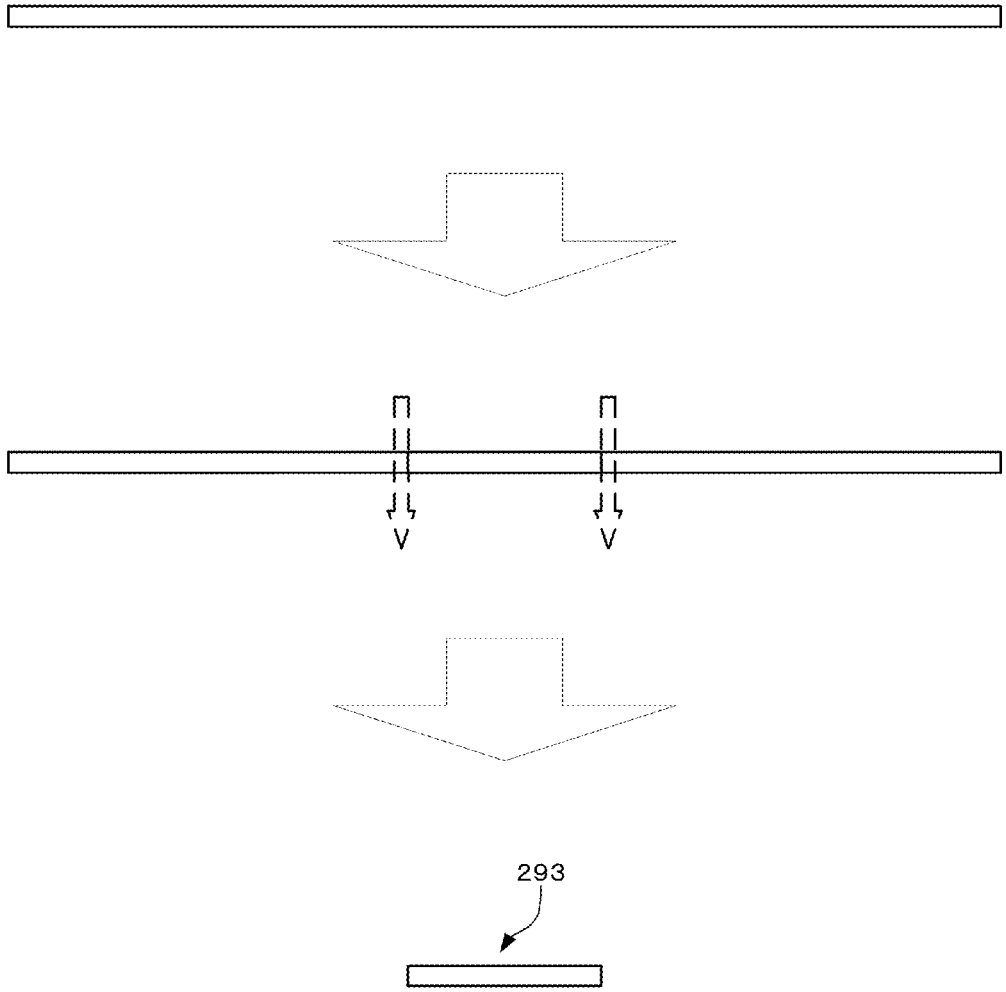
FIG. 12 shows views illustrating steps to cut out separators from a wafer commonly used for multiple products.

Here, before describing the next process, a step conducted prior to such process is described. Namely, prior to the next process, as shown in FIG. 11, a wafer used commonly for multiple products is cut using a laser or the like, for example, to form third and fourth upper-layer insulation layers 145, 115 of a predetermined size. Also, by cutting a wafer commonly used for multiple products using a laser or the like, separator 293 is prepared to be a predetermined size as shown in FIG. 12. Separator 293 is formed, for example, with cured prepreg, polyimide film or the like.

Figure 13A:
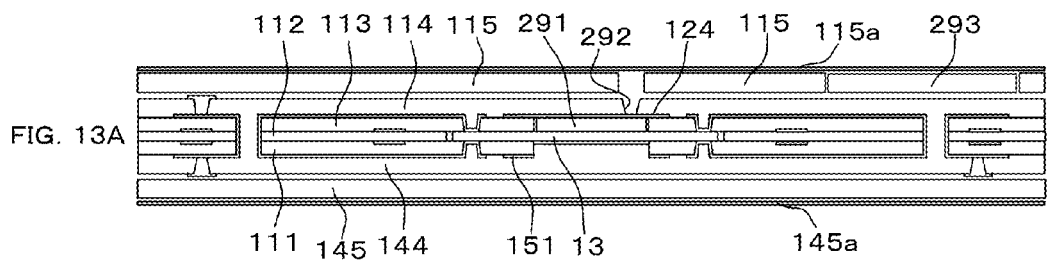
FIG. 13A is a view illustrating a step to form a third layer.

Then, in the following process, as shown in FIG. 13A, on the top and bottom of the substrate, third and fourth upper-layer insulation layers 145, 115, and separator 293, which were cut in the processes shown in FIGS. 11, 12, are disposed. Then, on their outside (on both top and bottom), conductive films (145a, 115a) made of copper, for example, are disposed. After that, by heating or the like, third and fourth upper-layer insulation layers 145, 115 are cured. Third and fourth upper-layer insulation layers 145, 115 are each formed with a regular prepreg made, for example, by impregnating glass cloth with resin.

Figure 13B:
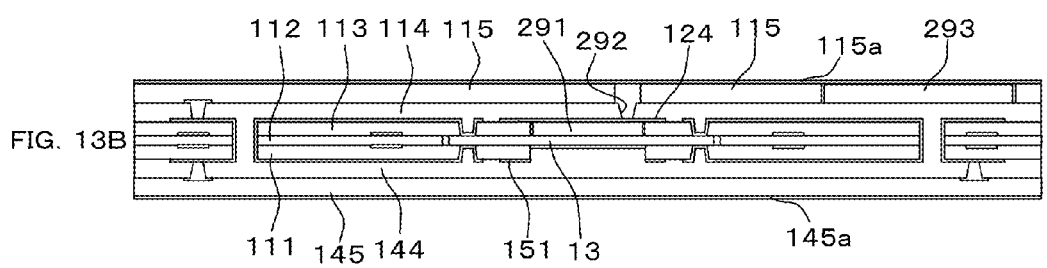
FIG. 13B is a view illustrating a step to form a third layer.
Figure 13C:
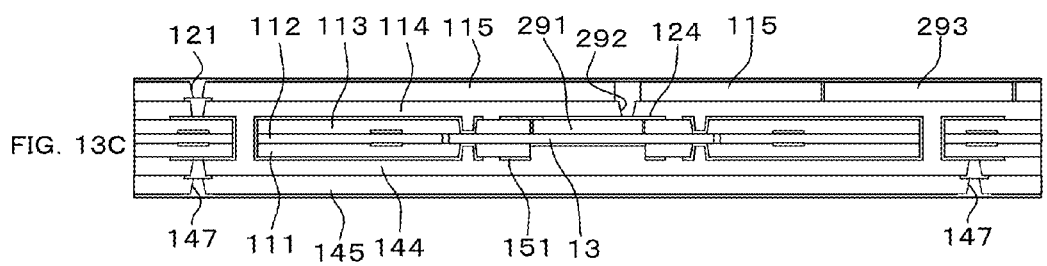
FIG. 13C is a view illustrating a step to form a third layer.

In the following, the resultant structure is pressed as shown in FIG. 13B. After that, conductive films (145a, 115a) are each made thinner to a predetermined thickness by half etching, for example. Then, after conducting pretreatment, vias 147, 121 are formed in third and fourth upper-layer insulation layers 145, 115 respectively using a laser, for example. After conducting a desmear process (removing smears) and soft etching, vias 147, 121 are filled with conductor, for example, as shown in FIG. 13C, through PN plating (for example, chemical copper plating and electrical copper plating). In doing so, by filling the interiors of vias 147, 121 with the same conductive paste material, connection reliability may be enhanced when thermal stresses are exerted on vias 147, 121. The conductor may also be formed by printing conductive paste (such as thermosetting resin containing conductive particles) by, for example, screen printing.

Figure 13D:
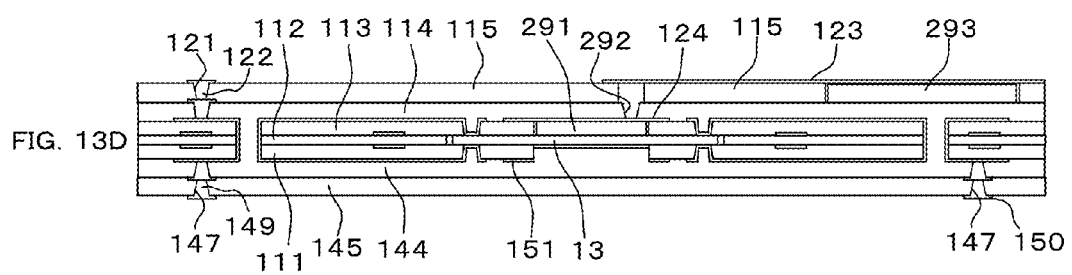
FIG. 13D is a view illustrating a step to form a third layer.

In the following, as shown in FIG. 13D, the surfaces of the substrate are made thinner to a predetermined thickness by half etching, for example. After that, the copper films on the substrate surfaces are patterned, for example, through a predetermined lithography process (pretreatment, laminating, exposing to light, developing, etching, removing the film, inspecting inner layers and so forth). In doing so, conductors 149, 122 and conductive patterns 150, 123 are formed. Then, a black oxide treatment is performed on the resultant structure.

Next, as shown in FIG. 14A, fifth and sixth upper-layer insulation layers 172, 173 are disposed on the top and bottom of the resultant structure, then on its outside (on both top and bottom), conductive films (172a, 173a) made of copper, for example, are disposed. Fifth and sixth upper-layer insulation layers 172, 173 are formed, for example, with a prepreg made by impregnating glass cloth with resin.

In the following, the structure is pressed as shown in FIG. 14B. After that, conductive films (172a, 173a) are made thinner to a predetermined thickness by half etching, for example. Then, after conducting a predetermined pretreatment, vias 174, 175 are formed respectively in fifth and sixth upper-layer insulation layers 172, 173 by laser beams or the like. Also, as shown in FIG. 14C, the insulation layer in each portion indicated by the broken lines in FIG. 14B is removed: namely, the insulation layers at the edges of separator 291 (the border portions between second insulation layer 113 and separator 291) and the insulation layers at the edges of separator 293 (the border portions between fourth upper-layer insulation layer 115 and separator 293). Accordingly, cutoff lines (notches) (294a-294c, 295a and 295b) are formed. At that time, cutoff lines (294a-294c) are formed (cut) using, for example, conductive patterns 151, 124 as a stopper; and cutoff lines (295a-295b) are formed using, for example, conductive pattern 123 as a stopper. During that time, the energy or beam time may be adjusted so that a certain amount of conductive patterns 123, 124, 151, which are used as stoppers, will be cut.

In the following, by performing PN plating (for example, chemical copper plating and electrical copper plating), conductors are formed on the entire surfaces of the substrate including the interiors of vias 174, 175. Then, the copper foils on the substrate surfaces are made thinner to a predetermined thickness by half etching, for example. After that, the copper foils on the substrate surfaces are patterned, for example, through a predetermined lithography process (pretreatment, laminating, exposing to light, developing, etching, removing the film and so forth). In doing so, conductive patterns 176, 177 are formed as shown in FIG. 14D. After forming the conductive patterns, those patterns are inspected.

In the following, solder resists are formed on the entire surfaces of the substrate by screen printing, for example. Then, as shown in FIG. 14E, the solder resists are patterned through a predetermined lithography process. After that, patterned solder resists 298, 299 are set, for example, by heating or the like.

In the following, after drilling and outline processing are conducted around the edges of separator 291 and the edges of separator 293 (see broken lines in FIG. 14B), structures 301-303 are removed by tearing them off from flexible substrate 13 as shown in FIG. 15A. During that time, separation is easily done because separators 291, 293 are arranged. Also, when structures 301-303 are separated (removed) from the rest, since conductive pattern 151 is not adhered, but is only pressed onto coverlays 138, 139 of flexible substrate 13 (see FIG. 9C), portions of conductive pattern 151 (the areas that come in contact with flexible substrate 13) are also removed along with structures 301-303.

As described, by exposing the center portion of flexible substrate 13, spaces (regions (R1, R2)) which allow flexible substrate 13 to warp (bend) are formed on the top and bottom (in the direction where insulation layers are laminated) of flexible substrate 13. By doing so, flex-rigid wiring board 10 may be bent or the like at those portions of flexible substrate 13.

Furthermore, on a surface of flex-rigid wiring board 10, especially on the area of separator 293 (region R3) on a surface of rigid substrate 12, recessed section (cavity) 300 is formed. Such recessed section 300 may be used, for example, to accommodate an electronic component, as described earlier.

At the tip of each insulation layer facing the removed areas (regions (R1-R3)), conductive patterns 124, 151 as well as conductive pattern 123 remain as shown, for example, in broken lines in FIG. 15B. The remaining copper is removed according to requirements by, for example, mask etching (pretreatment, laminating, exposing to light, developing, etching, removing the film and so forth) as shown in FIG. 15C.

In the following, electrodes 178, 179 are formed by chemical gold plating, for example. After that, through outline processing, warp correction, conductivity testing, exterior inspection and final inspection, flex-rigid wiring board 10 is completed as shown earlier in FIG. 3. As described above, flex-rigid wiring board 10 has a structure in which the tips of substrate 13 are sandwiched between the core sections (first and second insulation layers 111, 113) of rigid substrates 11, 12, and each land of rigid substrates 11, 12 and each connection pad of flexible substrate 13 are connected through plated films. Also, on a surface of flex-rigid wiring board 10, recessed section 300 is formed.

In the above, flex-rigid wiring board 10 according to an embodiment of the present invention was described. However, the present invention is not limited to such an embodiment.

Figure 16:
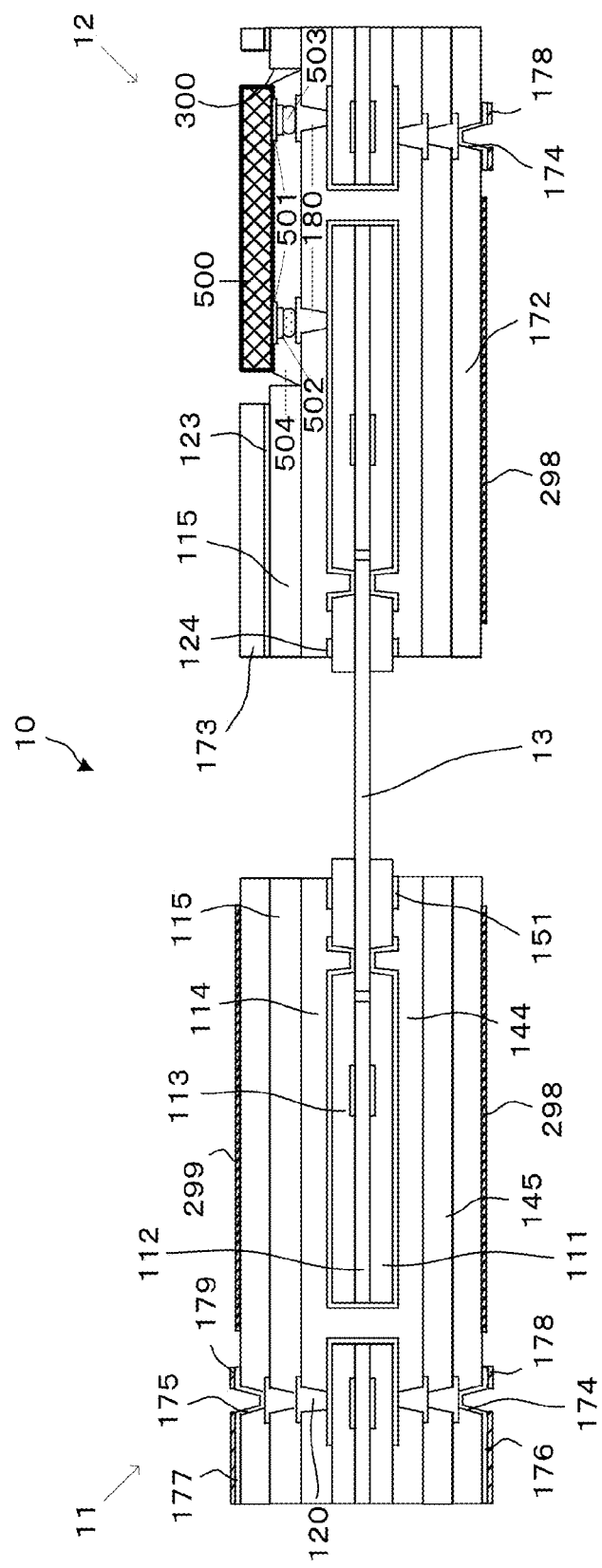
FIG. 16 is a view illustrating a modified example of a flex-rigid wiring board.
Figure 17:
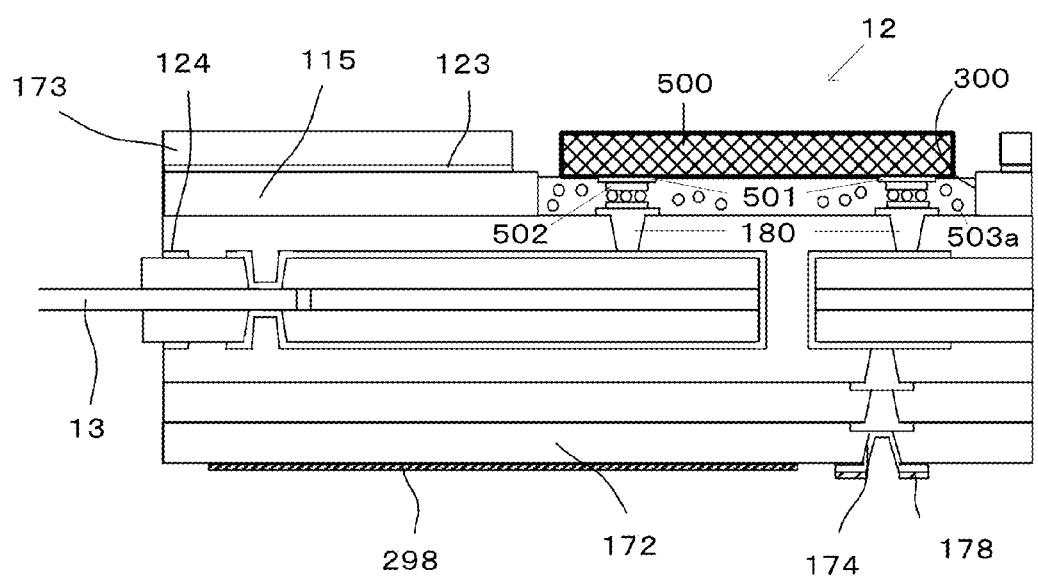
FIG. 17 is a view showing a flex-rigid wiring board in which an electronic component is arranged in the recessed section.

For example, as shown in FIG. 16, forming connection terminals 180 to mount an electronic component in recessed section 300 makes it easier to mount an electronic component. Connection terminals 180 are formed at the same time as forming conductors 120 through a process shown in FIGS. 10C, 10D, for example. In an example shown in FIG. 16, electronic component 500 (IC chip) is mounted by a so-called flip-chip connection. Specifically, Au bump 502 formed on electrode 501 of electronic component 500 is electrically connected to connection terminal 180 via conductive adhesive agent 503. Then, insulation resin 504 covers the connected area.

Furthermore, the material or the like for the electrodes and wiring to mount such an electronic component is not limited to a specific type. For example, electronic component 500 and connection terminals 180 may be electrically connected using an ACF (Anisotropic Conductive Film) that contains conductive particles (503a). Alignment may be easily conducted by such an ACF connection. Also, an electronic component may be mounted using an Au—Au connection, for example. Using an Au—Au connection, connected sections may be formed to be corrosion-resistant.

Figure 18A:
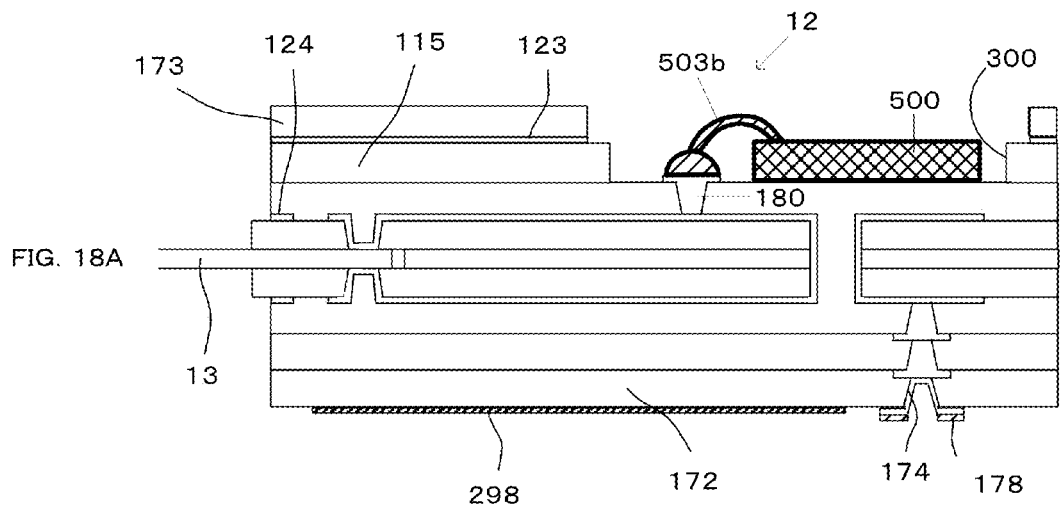
FIG. 18A is a view showing a modified example of how an electronic component is mounted.
Figure 18B:
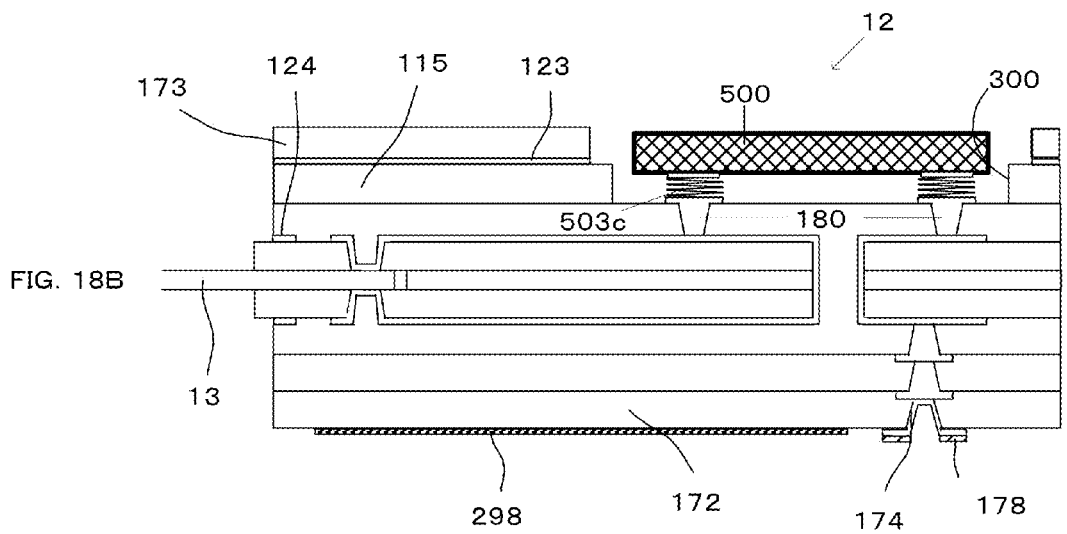
FIG. 18B is a view showing a modified example of how an electronic component is mounted.

Also, connection methods are not limited to a flip-chip connection, but any method may be employed. For example, as shown in FIG. 18A, an electronic component may be mounted by wire bonding using wire (503b). Also, as shown in FIG. 18B, for example, an electronic component may be mounted via springs (503c). Alternatively, an electronic component may be mounted using connectors.

Figure 19A:
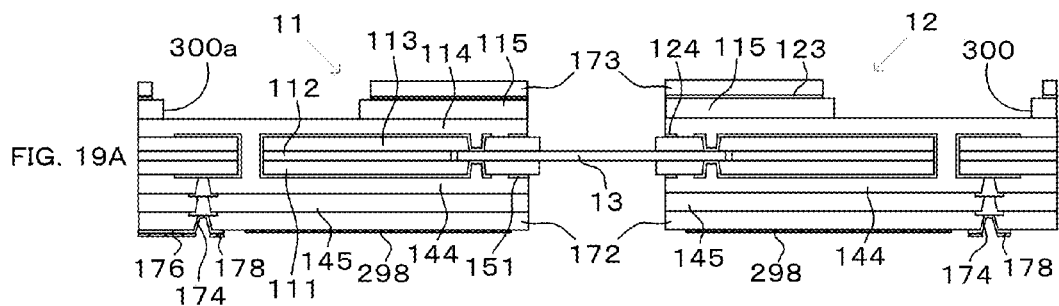
FIG. 19A is a view illustrating another modified example of a flex-rigid wiring board.
Figure 19B:
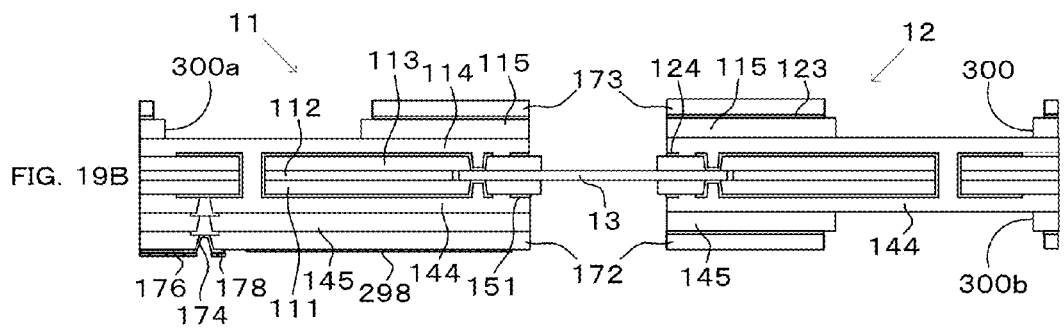
FIG. 19B is a view illustrating yet another modified example of a flex-rigid wiring board.
Figure 19C:
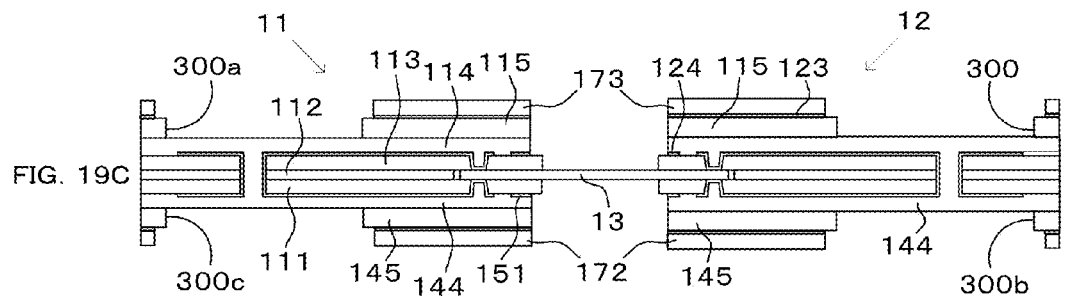
FIG. 19C is a view illustrating yet another modified example of a flex-rigid wiring board.

Also, as shown in FIG. 19A, for example, not only on a surface of rigid substrate 12, but on a surface of rigid substrate 11, recessed section (300a) may also be formed. Alternatively, in addition to recessed section (300a) on a surface of rigid substrate 11 (on one end surface in a direction in which insulation layers are laminated), on the top and bottom (on both end surfaces in the directions in which insulation layers are laminated) of rigid substrate 12, recessed sections (300, 300b) may be formed respectively. Furthermore, as shown in FIG. 19C, in addition to recessed sections (300, 300b) on the top and bottom of rigid substrate 12, recessed sections (300a, 300c) may also be formed respectively on the top and bottom of rigid substrate 11.

Such a recessed section (cavity) may also be formed without employing a method to use separator 293 as described above, but by using a selective etching or the like to remove the area (region R3) corresponding to the space of the separator. However, if separator 293 is used, a deep recessed section (cavity) may be easily formed.

In the above embodiment, the option exists to modify the material and size of each layer and the number of layers. For example, instead of a prepreg, an RCF (Resin Coated Copper Foil) may be used.

Figure 20:
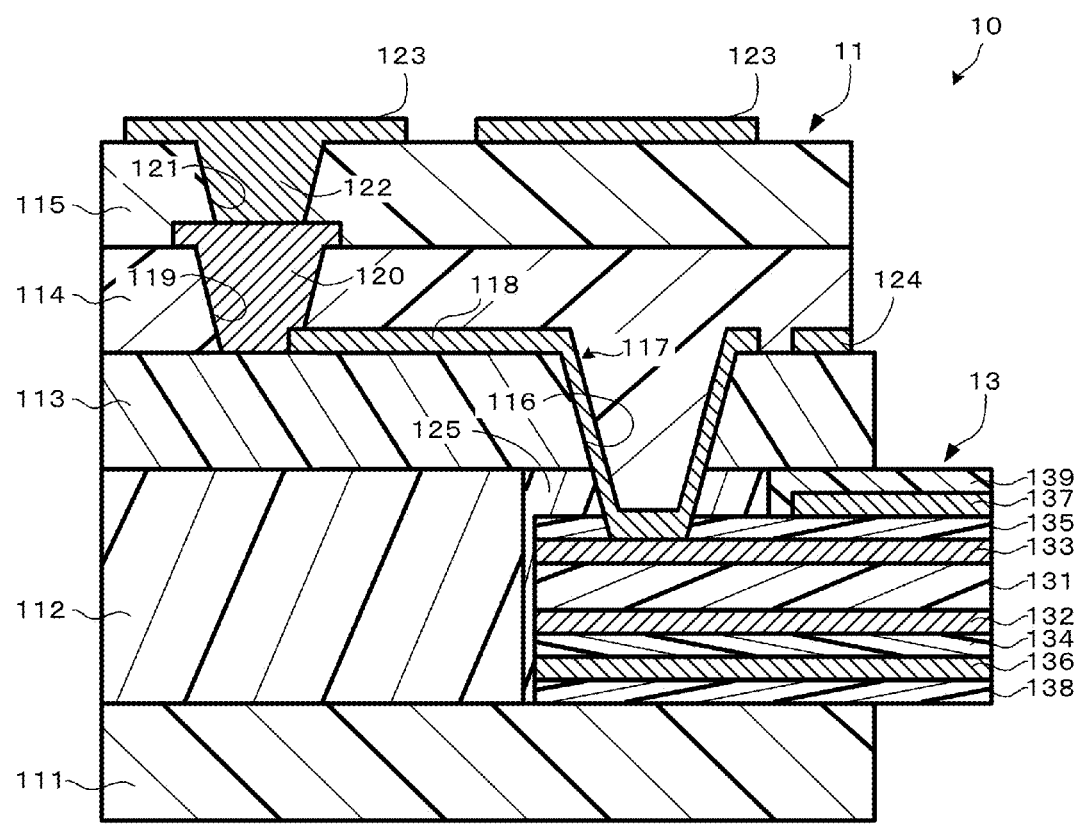
FIG. 20 is a view illustrating yet another modified example of a flex-rigid wiring board.

Also, as shown in FIG. 20, for example, rigid substrate 11 may have conductor (wiring layers) only on either the top or the bottom of the core (the same as in rigid substrate 12).

Figure 21A:
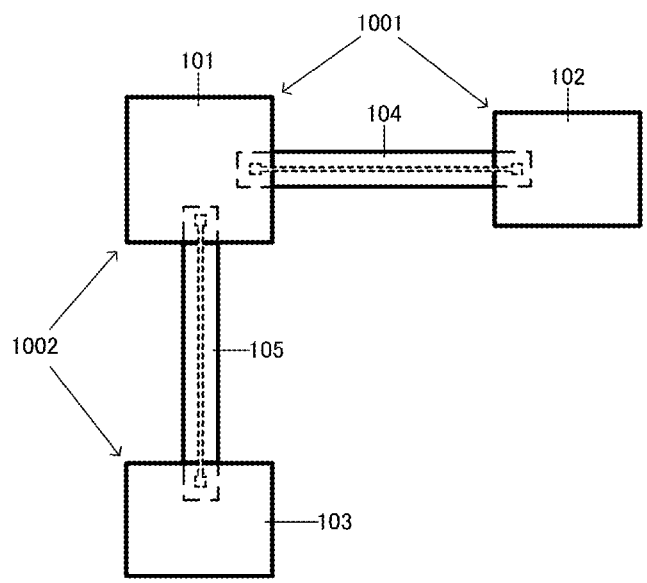
FIG. 21A is a view illustrating yet another modified example of a flex-rigid wiring board.
Figure 21B:
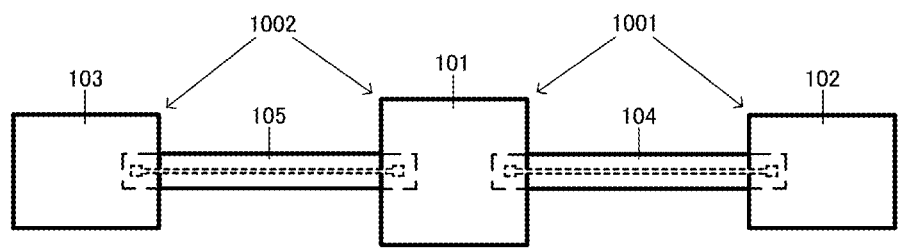
FIG. 21B is a view illustrating yet another modified example of a flex-rigid wiring board.

Alternatively, three or more rigid substrates may also be connected using flexible substrates. For example, as shown in FIG. 21A or FIG. 21B, paired rigid substrates (opposing rigid substrates) arranged opposite each other by sandwiching flexible substrates 104, 105 may be structured such as opposing rigid substrates 1001 formed with rigid substrate 101 and rigid substrate 102, and opposing rigid substrates 1002 formed with rigid substrate 101 and rigid substrate 103. Rigid substrates 102, 103 are arranged opposite to face common substrate 101. In an example shown in FIG. 21A, opposing rigid substrates 1001 and opposing rigid substrates 1002 are arranged at an angle of 90 degrees to each other. In an example shown in FIG. 21B, opposing rigid substrates 1001 and opposing rigid substrates 1002 are arranged at an angle of 180 degrees to each other. Regarding flex-rigid wiring boards having such structures, by forming at least one recessed section on one main surface or on both top and bottom surfaces in at least one substrate among those three substrates 101-103, substantially the same effect as above may be expected. Also, a structure having three or more pairs of opposing substrates may be employed.

A flex-rigid wiring board according to the first aspect of the present invention is formed with a rigid substrate having one or more conductors and a flexible substrate having one or more conductors. One or more recessed portions are formed on a surface of the rigid substrate, and one or more conductors of the flexible substrate and one or more conductors of the rigid substrate are electrically connected.

The structure may be made in such a way that at least part of the flexible substrate is embedded in the rigid substrate, and one or more conductors of the flexible substrate and one or more conductors of the rigid substrate are electrically connected in the embedded area.

The structure may be made in such a way that one or more of the rigid substrates are formed by laminating multiple insulation layers.

The structure may be made in such a way that one or more connection terminals to mount an electronic component are formed in one or more recessed portions.

The structure may be made in such a way that an electronic component is mounted on the connection terminal formed in one or more recessed portions.

The structure may be made in such a way that the electronic component is mounted on the connection terminal by flip-chip connection.

The structure may be made in such a way that the flexible substrate has a conductive pattern, the rigid substrates are arranged horizontal to the flexible substrate, an insulation layer is formed to cover the flexible substrate and the rigid substrates, while exposing at least part of the flexible substrate, a conductive pattern is formed on the insulation layer; and the conductive pattern of the flexible substrate and the conductive pattern on the insulation layer are connected through a plated film.

A flex-rigid wiring board according to the second aspect of the present invention is formed with multiple rigid substrates each having one or more conductors and a flexible substrate having one or more conductors. The multiple rigid substrates form one or more pairs of opposing rigid substrates positioned side by side of each other with the flexible substrate sandwiched in between, one or more recessed portions are formed on a surface of one or more rigid substrates making up the opposing rigid substrates, and one or more conductors of the flexible substrate and one or more conductors of the rigid substrate are electrically connected.

The structure may be made in such a way that one or more recessed portions are formed either on one main surface or on both the top and bottom surfaces of one substrate among the rigid substrates that make up the opposing rigid substrates.

The structure may be made in such a way that one or more recessed portions are formed either on one main surface or on both the top and bottom surfaces of the other substrate adjacent to the first substrate among the rigid substrates that make up the opposing rigid substrates.

The structure may be made in such a way that one or more recessed portions are formed on the top and bottom surfaces respectively of one substrate among the rigid substrates that make up the opposing rigid substrates.

The structure may be made in such a way that one or more recessed portions are formed on the top and bottom surfaces respectively of the other substrate adjacent to the first substrate among the rigid substrates that make up the opposing rigid substrates.

The structure may be made in such a way that at least part of the flexible substrate is embedded in a rigid substrate, and one or more conductors of the flexible substrate and one or more conductors of the rigid substrate are electrically connected at the embedded area.

The structure may be made in such a way that one or more of the rigid substrates are formed by laminating multiple insulation layers.

The structure may be made in such a way that one or more connection terminals to mount an electronic component are formed in one or more recessed portions.

The structure may be made in such a way that an electronic component is mounted on the connection terminal formed in one or more recessed portions.

The structure may be made in such a way that the electronic component is mounted on the connection terminal by flip-chip connection.

The structure may be made in such a way that the flexible substrate has a conductive pattern, the opposing rigid substrates are arranged horizontal to the flexible substrate, an insulation layer is formed to cover the flexible substrate and the rigid substrates, while exposing at least part of the flexible substrate, a conductive pattern is formed on the insulation layer, and the conductive pattern of the flexible substrate and the conductive pattern on the insulation layer are connected through a plated film.

A flex-rigid wiring board according to the third aspect of the present invention is formed with multiple rigid substrate each having one or more conductors and multiple flexible substrates each having one or more conductors. The multiple rigid substrates form two or more pairs of opposing rigid substrates positioned side by side of each other with the flexible substrates sandwiched in between, one or more recessed portions are formed on a surface of one or more of the rigid substrates that make up the opposing rigid substrates, and one or more conductors of the flexible substrate are electrically connected to one or more conductors of the rigid substrates.

The structure may be made in such a way that one or more recessed portions are formed either on one main surface or on both the top and bottom surfaces of one substrate among the rigid substrates that make up one or more pairs of opposing rigid substrates.

The structure may be made in such a way that one or more recessed portions are formed either on one main surface or on both the top and bottom surfaces of one or more of other substrates adjacent to the first substrate among the rigid substrates that make up at least one pair of opposing rigid substrates.

The structure may be made in such a way that one or more recessed portions are formed on the top and bottom surfaces respectively of one substrate among the rigid substrates that make up at least one pair of opposing rigid substrates.

The structure may be made in such a way that one or more recessed portions are formed on the top and bottom surfaces respectively of one or more other substrates adjacent to the first substrate among the rigid substrates that make up one or more pairs of opposing rigid substrates.

The structure of at least two pairs of opposing rigid substrates may be made in such a way that two or more rigid substrates are each arranged adjacent to a common rigid substrate with the flexible substrates sandwiched in between.

The structure may be made in such a way that at least part of the flexible substrate is embedded in a rigid substrate, and one or more conductors of the flexible substrate and one or more conductors of the rigid substrate are electrically connected at the embedded area.

The structure may be made in such a way that one or more of the rigid substrates is formed by laminating multiple insulation layers.

The structure may be made in such a way that one or more connection terminals to mount an electronic component is formed in one or more recessed portions.

The structure may be made in such a way that an electronic component is mounted on the connection terminal formed in one or more recessed portions.

The structure may be made in such a way that the electronic component is mounted on the connection terminal by flip-chip connection.

The structure may be made in such a way that the flexible substrate has a conductive pattern, one or more pairs of the opposing rigid substrates is arranged horizontal to the flexible substrate, an insulation layer is formed to cover the flexible substrate and the rigid substrates, while exposing at least part of the flexible substrate, a conductive pattern is formed on the insulation layer, and the conductive pattern of the flexible substrate and the conductive pattern on the insulation layer are connected through a plated film.

A method for manufacturing a flex-rigid wiring board according to the fourth aspect of the present invention is a method for manufacturing a flex-rigid wiring board having a rigid substrate formed by laminating insulation layers. A recessed portion is formed according to the shape of a separator on a surface of the rigid substrate by laminating the insulation layers after the separator is arranged, and by removing the separator together with the upper-layer insulation layers after the lamination.

When the separator is removed, cutoff lines may be formed at predetermined spots in the upper-layer insulation layers, and then the separator may be detached from the rest at the cutoff lines along with the upper-layer insulation layers.

Obviously, numerous modifications and variations of the present invention are possible in light of the above teachings. It is therefore to be understood that within the scope of the appended claims, the invention may be practiced otherwise than as specifically described herein.

What is claimed is:

1. A flex-rigid wiring board comprising:
   a rigid substrate comprising a rigid base material, a first insulation layer formed on the rigid base material, a second insulation layer formed on the first insulation layer, and a conductor layer formed on the first insulation layer; and a flexible substrate aligned with the rigid base material of the rigid substrate in a longitudinal direction of the flexible substrate and having an end portion partially embedded in the rigid substrate, the flexible substrate comprising a conductor layer electrically connected to the conductor layer of the rigid substrate, wherein the flexible substrate has a thickness which is substantially equal to a thickness of the rigid base material of the rigid substrate and has surfaces which are horizontal with respect to surfaces of the rigid base material of the rigid substrate in the longitudinal direction, the rigid substrate comprises at least one connection terminal formed through the second insulation layer and positioned to mount an electronic component and electrically connect the electronic component with the conductor layer of the rigid substrate, and the rigid substrate has a recessed portion configured to accommodate the electronic component and formed on a surface of the rigid substrate such that the recessed portion exposes the at least one connection terminal and a portion of the second insulation layer over the rigid base material of the rigid substrate.

2. The flex-rigid wiring board according to claim 1, wherein the conductor layer of the flexible substrate is electrically connected to the conductor layer of the rigid substrate in the end portion of the flexible substrate partially embedded in the rigid substrate.

3. The flex-rigid wiring board according to claim 1, wherein the rigid substrate further includes a plurality of insulation layers laminated over the first insulation layer, the second insulation layer, and the rigid base material.

4. The flex-rigid wiring board according to claim 1, wherein the electronic component is mounted on the connection terminal by flip-chip connection.

5. The flex-rigid wiring board according to claim 1, wherein the rigid substrate is connected to the flexible substrate in a horizontal direction, the first insulation layer covers the end portion of the flexible substrate embedded in the rigid substrate while exposing at least a portion of the flexible substrate, and the conductor layer of the flexible substrate is connected to the conductor layer of the rigid substrate via a plated film through the first insulation layer.

6. A flex-rigid wiring board comprising:
a plurality of rigid substrates each comprising a rigid base material, a first insulation layer formed on the rigid base material, a second insulation layer formed on the first insulation layer, and a conductor layer formed on the first insulation layer; and at least one flexible substrate aligned with the rigid base material of the rigid substrate in a longitudinal direction of the flexible substrate and having end portions partially embedded in the rigid substrates, respectively, the flexible substrate comprising a conductor layer electrically connected to the conductor layer of each of the rigid substrates, wherein the flexible substrate has a thickness which is substantially equal to a thickness of the rigid base material of each of the rigid substrates and has surfaces which are horizontal with respect to surfaces of the rigid base material of each of the rigid substrates in the longitudinal direction, at least one of the rigid substrates comprises at least one connection terminal formed through the second insulation layer and positioned to mount an electronic component and electrically connect the electronic component with the conductor layer of the rigid substrate, and the rigid substrate has a recessed portion configured to accommodate the electronic component and formed on a surface of the rigid substrate such that the recessed portion exposes the at least one connection terminal and a portion of the second insulation layer over the rigid base material of the rigid substrate.

7. The flex-rigid wiring board according to claim 6, wherein the plurality of rigid substrates includes a pair of opposing rigid substrates, and the at least one recessed portion is formed on top and bottom surfaces of one of the opposing rigid substrates.

8. The flex-rigid wiring board according to claim 6, wherein the at least one recessed portion comprises a plurality of recessed portions, and the opposing rigid substrates have the recessed portions, respectively, on top and bottom surfaces of the rigid substrates.

9. The flex-rigid wiring board according to claim 6, wherein the conductor layer of the flexible substrate is electrically connected to the conductor layer of each of the rigid substrates in the portions of the flexible substrate partially embedded in the rigid substrates, respectively.

10. The flex-rigid wiring board according to claim 6, wherein at least one of the rigid substrates further includes a plurality of insulation layers laminated over the first insulation layer, the second insulation layer, and the rigid base material of the one of the rigid substrates.

11. The flex-rigid wiring board according to claim 6, wherein the electronic component is mounted on the connection terminal by flip-chip connection.

12. The flex-rigid wiring board according to claim 6, wherein the rigid substrates are connected to the flexible substrate in a horizontal direction, the first insulation layers cover the end portions of the flexible substrate, respectively, while exposing at least a portion of the flexible substrate, and the conductor layer of the flexible substrate is connected to the conductor layer of each of the rigid substrates via a plated film through the insulation layer of each of the rigid substrates.

13. The flex-rigid wiring board according to claim 6, wherein the plurality of rigid substrates includes two opposing rigid substrates positioned side by side of each other with the flexible substrate sandwiched between the two opposing rigid substrates.

14. The flex-rigid wiring board according to claim 6, wherein the plurality of rigid substrates includes a common rigid substrate, a first rigid substrate and a second rigid substrate, the at least one flexible substrate comprises a plurality of flexible substrates, and the first and second rigid substrates are connected to the common rigid substrate through the flexible substrates, respectively.

15. The flex-rigid wiring board according to claim 1, wherein the flexible substrate is not positioned under the recessed portion of the rigid substrate.

16. The flex-rigid wiring board according to claim 6, wherein the flexible substrate is not positioned under the recessed portion of the rigid substrate.

* * * * *